United States Patent [19]

Opower et al.

[11] Patent Number: 5,324,552
[45] Date of Patent: Jun. 28, 1994

[54] PROCESS FOR COATING SUBSTRATE MATERIAL

[75] Inventors: Hans Opower, Krailling, Fed. Rep. of Germany; Kurt Koesters, Puchenau; Reinhold Ebner, Trofaiach, both of Austria

[73] Assignees: Deutsche Forschungsanstalt fuer Luft-und Raumfahrt e.V., Bonn, Fed. Rep. of Germany; Voest-Alpine Stahl Linz GmbH, Linz, Austria

[21] Appl. No.: 958,341

[22] Filed: Feb. 11, 1993

[30] Foreign Application Priority Data

Jun. 21, 1990 [DE] Fed. Rep. of Germany ....... 4019824
Jun. 22, 1990 [DE] Fed. Rep. of Germany ....... 4019965

[51] Int. Cl.$^5$ ............................................. B05D 3/06
[52] U.S. Cl. ................................. 427/533; 427/255.1; 427/294; 427/307; 427/534; 427/551; 427/554; 427/558; 427/562; 427/566; 427/572; 427/596; 427/598; 427/586
[58] Field of Search ............... 427/533, 534, 535, 551, 427/554, 558, 562, 566, 572, 586, 596, 598, 225.1, 294, 307

[56] References Cited

FOREIGN PATENT DOCUMENTS

| | | |
|---|---|---|
| 3527259 | 1/1986 | Fed. Rep. of Germany . |
| 3542613 | 6/1987 | Fed. Rep. of Germany . |
| 3615487 | 11/1987 | Fed. Rep. of Germany . |
| 136047 | 2/1978 | German Democratic Rep. . |

OTHER PUBLICATIONS

Patents Abstracts of Japan, Abstract No. 1-225,770, vol. 13, No. 549, Dec. 7, 1989.
Patent Abstracts of Japan, Abstract No. 1-191,774, vol. 13, No. 487, Nov. 6, 1989.
Patents Abstracts of Japan, Abstract No. 1-191,777, vol. 13, No. 487, Nov. 6, 1989.
Patent Abstracts of Japan, Abstract No. 1-319,673, vol. 14, No. 123, Mar. 8, 1990.
Patents Abstracts of Japan, Abstract No. 63-53,258, vol. 12, No. 275, Jul. 29, 1988.
Patent Abstracts of Japan, Abstract No. 60-194,067, vol. 10, No. 49, Feb. 26, 1986.

*Primary Examiner*—Bernard Pianalto
*Attorney, Agent, or Firm*—Barry R. Lipsitz

[57] ABSTRACT

To provide a process for coating substrate material in which coating material is ablated in an ablation region by a laser beam in a coating chamber containing a negative pressure, propagates in the form of a coating particle stream in the direction of the substrate material and is deposited on it in the form of a coating, with which substrate material can be coated in large quantities by laser ablation, it is proposed that the substrate material be flat material, that the flat material be passed continuously as a continuous strip through the coating chamber and coated under the negative pressure substantially maintained therein, and that the necessary coating material be fed to the coating chamber while the negative pressure is substantially maintained therein.

128 Claims, 9 Drawing Sheets

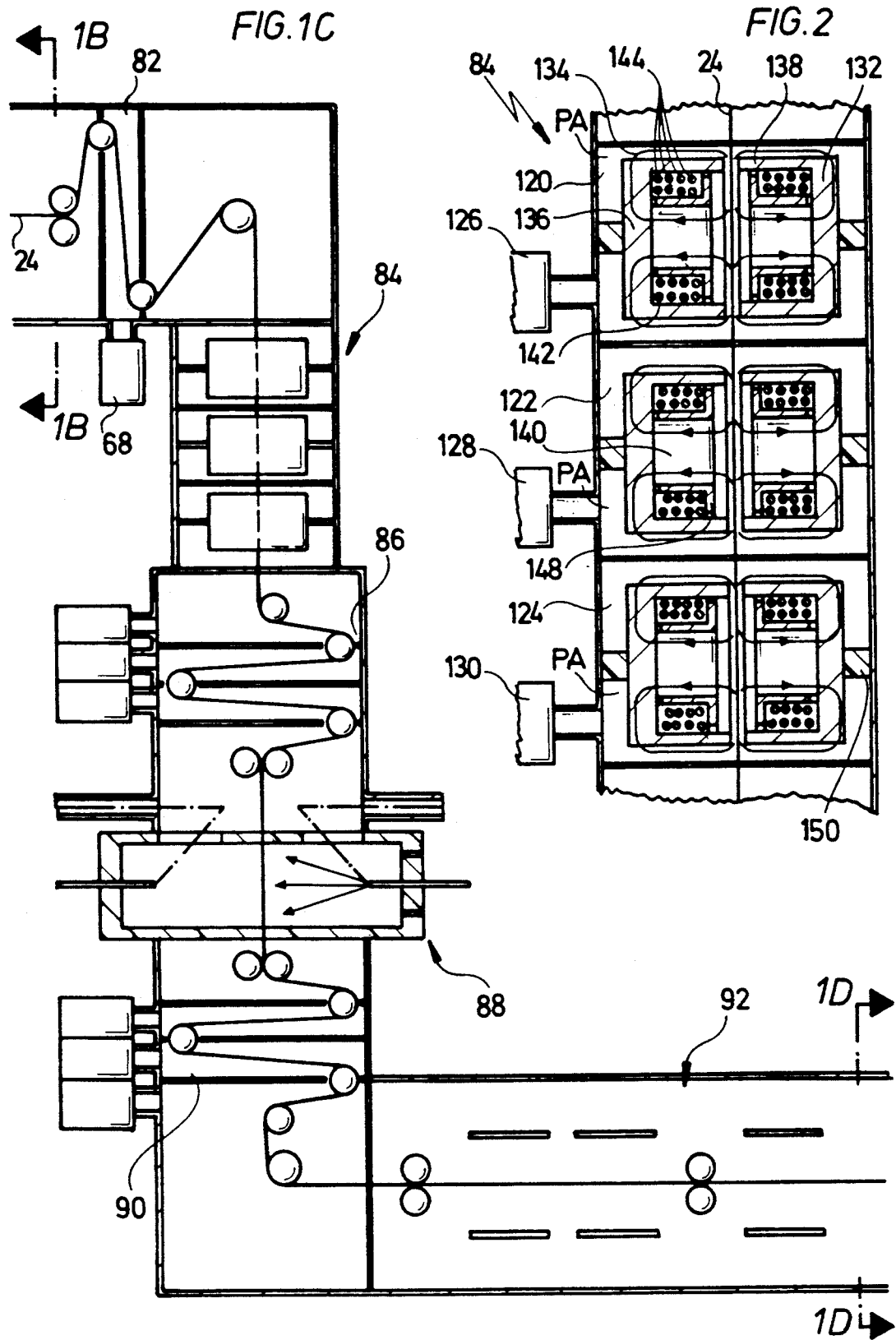

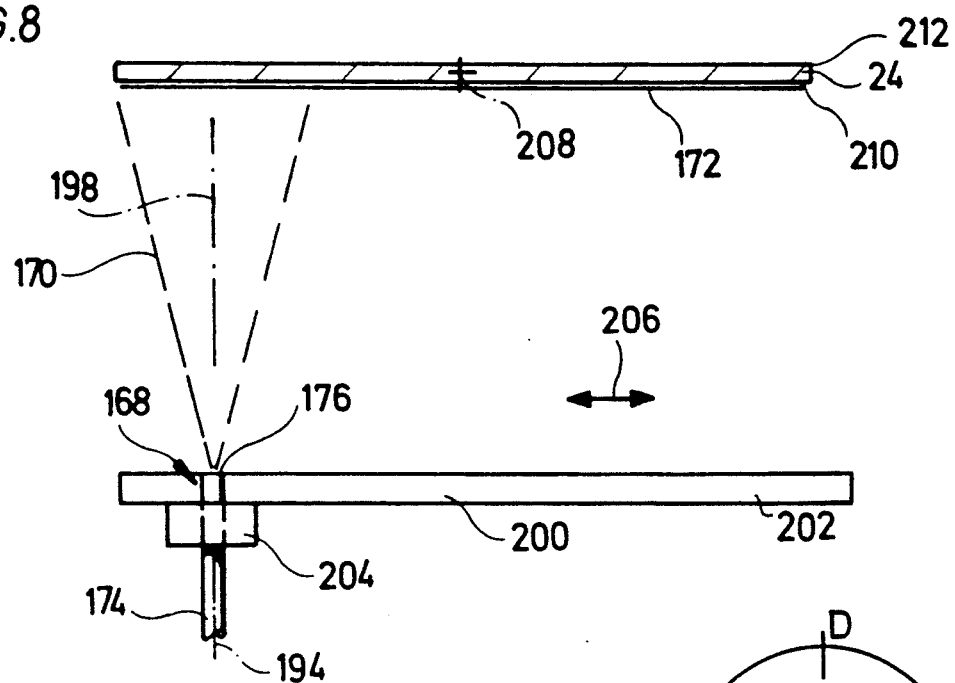
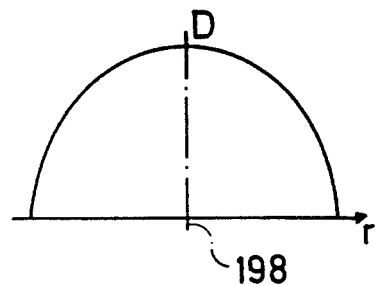
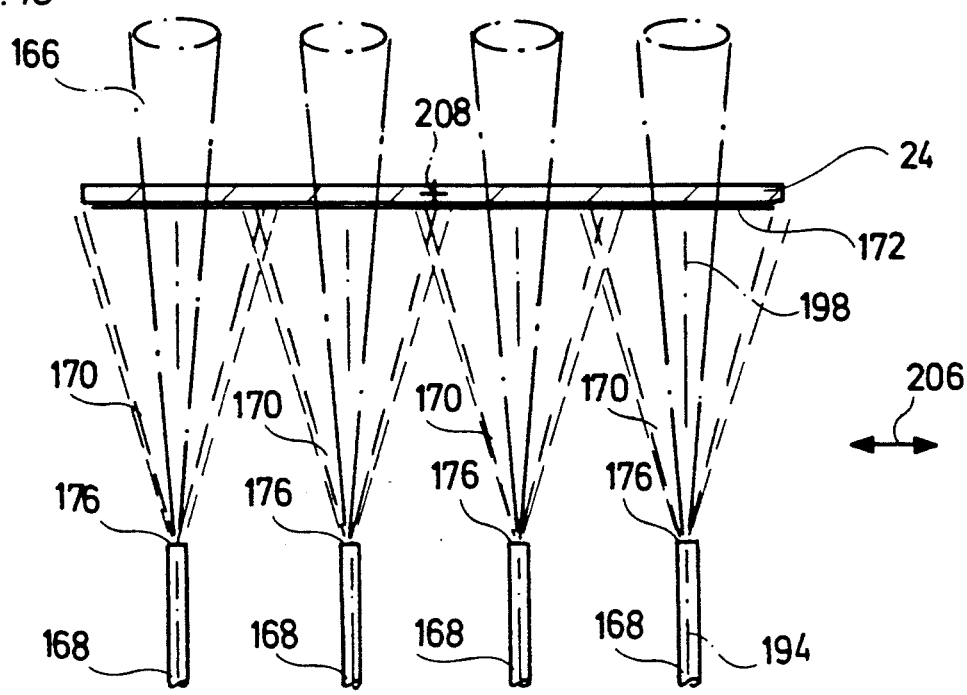

PROCESS FOR COATING SUBSTRATE MATERIAL

The invention relates to a process and a device for coating substrate material in which coating material is ablated in an ablation region by a laser beam in a coating chamber containing a negative pressure, propagates in the form of a coating particle stream in the direction of the substrate material and is deposited on it in the form of a coating.

Such processes are known from the prior art. However, in all these processes the substrate material to be coated is introduced into the coating chamber, the coating chamber is reduced to a negative pressure and the coating material is then ablated with a laser beam.

Such a process is not efficient for the production of large quantities of laser-coated substrate material and is, therefore, not employable.

The object underlying the invention is, therefore, to provide both a process and a device with which substrate material can be coated in large quantities by laser ablation.

This object is accomplished in accordance with the invention with a process and a device of the kind described at the beginning by the substrate material being flat material, by the flat material being passed continuously as a continuous strip through the coating chamber and coated under the negative pressure substantially maintained therein, and by the necessary coating material being fed to the coating chamber while the negative pressure is substantially maintained therein.

The advantage of the inventive process is, therefore, to be seen in the fact that by linking individual pieces of substrate material to form a continuous strip, it was made possible to pass this continuous strip continuously, i.e., at a constant speed or in certain feed cycles, through the coating chamber, to maintain the negative pressure in the coating chamber while doing so and to constantly carry out the coating while the continuous strip is continuously passed through it so that preferably a constant coating is produced on the substrate material, in the case according to the present invention, the continuous strip.

The pump-out times known from the prior art for producing the negative pressure in the coating chamber are thereby eliminated and it is thus made possible for the laser ablation to be employed on a large technical scale.

In employment on a large technical scale, owing to the continuous strip running continuously through the coating chamber, large quantities of coating material are also required to be introduced into the coating chamber, and it is, therefore, advantageous for the coating material to be supplied without interruption of the passage of the continuous strip.

It is, furthermore, expedient for the coating material to be supplied without interruption of the coating on the continuous strip.

The problem with the coating of the continuous strip on a large technical scale is also to be seen in the fact that the coating should be applied as uniformly as possible with permanent adherence to the continuous strip and, in particular, it should have a substantially uniform thickness.

Therefore, in a particularly preferred embodiment of the inventive process and the inventive device, in order to apply a uniform coating to the flat material, provision is made for the coating particle stream to be moved relative to the flat material with a component in the direction transverse to the direction of passage of the continuous strip.

On the one hand, this movement can be implemented by the coating particle stream being swivelled oscillatingly with a component in the transverse direction.

On the other hand, it is, however, also expedient for the coating particle stream to be displaced parallel with a component in the transverse direction. In order to keep the thickness of the coating constant, it is, furthermore, particularly advantageous, in the case of movement of the coating particle stream with a component in the transverse direction, for a spacing between the ablation region and the flat material, in particular, the region of the flat material contacted by the coating particle stream, to be kept substantially constant.

Several inventive solutions are provided for displacement of the coating particle stream with a component in the transverse direction relative to the flat material. For example, in one expedient solution for displacement of the coating particle stream with a component in the transverse direction, provision is made for the ablation region to be displaced with a component in the transverse direction.

Furthermore, in order to achieve as uniform a coating as possible in the transverse direction, i.e., over the width of the flat material or continuous strip, it is advantageous as an alternative to the displacement of the coating particle stream relative to the flat material or as a supplement to this, for several ablation regions to be provided.

In particular, it is expedient herein for the spacing of the ablation regions in the transverse direction to be selected such that the coating particle streams emanating from the individual ablation regions essentially do not superimpose one another. In this case, it must, however, be ensured that different coating particle stream densities are compensated in the coating particle streams.

As an alternative to this, it is, therefore, more advantageous within the scope of the present invention for the spacing of the ablation regions to be selected such that the coating particle streams emanating from these do superimpose one another. With this superposition, it is possible, at least in certain regions, to provide compensation for different coating particle stream densities.

Therefore, in a particularly preferred embodiment provision is made for the spacing to be selected such that the coating particle streams superimposing one another form an overall coating particle stream with an essentially constant coating particle stream density.

With the ablation regions provided in spaced relation to one another in the transverse direction, ablation can be carried out in many different ways. In one advantageous embodiment, provision is made for the ablation to be carried out on the ablation regions arranged in spaced relation to one another in the transverse direction one after the other with a single laser beam, i.e., a device provided for deflection of this single laser beam makes it contact the individual ablation regions one after the other. This has the advantage that one can work with a single laser and it is ensured that evaporation occurs essentially with the same energy production in each ablation region.

The procedure described hereinabove and the corresponding device do, however, have the disadvantage that the laser must have a very high power in order to produce the necessary laser power for the entire ablation.

For this reason, it is advantageous for the ablation to be carried out simultaneously with one laser beam each for the evaporation regions arranged in spaced relation to one another in the transverse direction. This laser beam can, for example, come from one laser, respectively, so that each ablation region is acted upon by the laser beam of a laser associated with it. It is, however, also conceivable for several ablation regions to be supplied via one laser, with the laser beam of this one laser then being divided up by corresponding geometrical optical means into different laser beams which lead to the different ablation regions. In this way, for example, the plurality of ablation regions can be supplied by a smaller number of lasers having individual ablation regions clearly associated with them. Furthermore, within the scope of the present invention it is conceivable to direct a laser beam of a single laser onto several ablation regions associated with it one after the other, but to simultaneously provide several lasers for carrying out the same with their laser beams so that a certain amount of the total number of ablation regions is acted upon one after the other by one laser beam respectively.

Furthermore, in order to achieve uniformity of the coating, in particular, of the density thereof, it is also expedient for several ablation regions for the coating material to be arranged in succession in the direction of passage of the continuous strip.

In these ablation regions arranged in succession in the direction of passage, the same coating material is preferably evaporated so that a greater layer growth is achievable with this arrangement and, furthermore, by placing the ablation regions arranged in succession in the direction of passage in offset relation in the transverse direction, even greater uniformity of the coating.

Moreover, the arrangement of several ablation regions in succession in the direction of passage of the continuous strip also makes it possible to ablate different coating material and thereby build up coatings containing different layers of different coating materials, or to also ablate different coating materials under different ablation conditions, but to ensure that the coating particle streams intermix and thus result in a mixed coating, with the mixing proportions of this mixed coating being changeable in dependence upon the ablation conditions for the individual coating materials.

With different coating materials, it is particularly expedient for the flat material to be coated by a first coating particle stream having in the transverse direction essentially a constant coating particle stream density and simultaneously by a second coating particle stream arranged in offset relation in the direction of passage of the continuous strip and having in the transverse direction essentially a constant coating particle stream density.

For example, when, in accordance with the invention, the coating particle streams carry the same coating material, a coating with as slight differences as possible in the thickness, and when the coating particle streams carry different coating material, a mixed coating or a coating with separate layers of coating materials of essentially constant thickness at least in its entirety, could thereby be applied.

In the description of the embodiments hereinabove, no details were given as to how the coating material is to be introduced into the coating chamber and ablated.

In a particularly preferred embodiment, provision is made for the coating material to be ablated from a solid.

In the simplest case, the solid is made of the coating material.

In particular with mixed coatings, provision is, however, also made for the solid to be made of several coating materials, and the laser ablation offers the great advantage that the different coating materials can be ablated essentially in the same way.

In the simplest case, in particular for the production of a mixed coating, provision is made for the solid to be made up of an essentially homogeneous mixture of coating materials which can be ablated particularly easily with laser radiation and applied in the form of a layer which is as homogeneous as possible to the flat material.

It is, however, also conceivable for the solid to comprise several coating materials in spatially separate arrangement, with, for example, the change of the coating materials being made possible by the ablation region moving on the solid.

As an alternative to the ablation of coating material, starting from a solid, it is, however, also conceivable for the coating material to be ablated from a molten mass. The coating material can be continuously fed into the coating chamber in a particularly advantageous way from a molten mass and, for example, by keeping the surface level of the molten mass constant, the spacing between the ablation region and the flat material can be kept constant in a simple way over a long period of time.

In all of the embodiments of the inventive process and the inventive device in which the coating material is ablated from a solid, provision is preferably made for the coating material to be introduced into the coating chamber in the form of a target.

In order to ablate the coating material from the target as advantageously as possible, provision is made in an expedient embodiment for the ablation region to be arranged at an end face of the target made of coating material.

As an alternative to this, it is, however, also advantageous, in an inventive way, for the ablation region to be arranged at a front lateral end of the target made of coating material.

In all cases, there is the problem that the coating material has to be removed as uniformly as possible from the target. For this reason, provision is made in an advantageous solution according to the invention for the ablation region to travel by relative movement between the target and the laser beam on the target.

The above-mentioned solution is particularly advantageous when the travel of the ablation region results in a uniform shape of the target in its ablated regions, i.e., when the target is always kept in a certain shape by the travel of the ablation region. It is, for example, conceivable to design the ablated region of the target as a flat surface and to maintain the shape of the surface by travel of the ablation region. It is, however, also conceivable to design the ablated region of the target as cone or cap of a sphere and to maintain the shape of this cone or this cap of a sphere by travel of the ablation region.

In the simplest case, provision is made in a preferred solution for the relative movement between laser beam and target to be implemented by movement of the laser beam. This is expedient because the laser beam is moveable in a simple way, for example, by optical deflection means. At the same time, this results in the ablated coating particle stream also travelling spatially relative to the target with the movement of the laser beam, which with a stationary target and a flat material displaceable in the transverse direction results in travel of the coating particle stream relative to the flat material, whereby different coating particle stream densities in the coating particle stream are achievable.

As an alternative to this, it is, however, also advantageous for the relative movement between the laser beam and the target to be implemented by movement of the target. This has the advantage that with a stationary laser beam, the coating particle stream does also not travel, which is likewise expedient in all of the embodiments in which a stationary coating particle stream is desired.

Introduction of the coating material into the coating chamber can be made possible in a particularly simple way by the target being in the form of a continuous strand. Provision is then preferably made for the strand to have a round cross-section.

However, as an alternative to this it is also conceivable within the scope of the inventive solution for the strand to be in the form of a strip, preferably with a rectangular cross-section.

The strand offers the advantage of easy introduction into the coating chamber, namely by the strand being introduced through a sealed lock into the coating chamber and being continuously fed.

As an alternative to introducing the coating material in the form of a strand, provision is made in another inventive solution for the target to be formed by pieces of coating material which are separated from one another.

In this case, it is then expedient for the coating material to be introduced in these pieces into the coating chamber.

In order to maintain the negative pressure in the coating chamber, provision is made for the pieces to be introduced through a lock into the coating chamber.

It is particularly advantageous, in particular in order not to interrupt the coating procedure, for a further piece to be introduced into the coating chamber while the coating material is being ablated from one piece.

So far, no details were given about the shape of the pieces. Here, it is advantageous for the pieces to have the shape of elongated cylinders.

Furthermore, in particular to achieve uniform removal of the coating material from these pieces, it is advantageous for the cylinders to be mounted rotatingly about their cylinder axis. Movement of the ablation region relative to the target is thereby achieved in a simple way.

In a preferred arrangement, provision is made for the cylinder axis to extend transversely to the direction of movement of the continuous strip.

Furthermore, it is advantageous for the cylinder axis to be aligned essentially parallel to the surface of the continuous strip or the flat material for, in this case, it is, for example, possible in a particularly simple way to let the coating particle stream travel by movement of the ablation region.

Introduction of the pieces is achieved in a particularly simple way by the pieces being arranged in a magazine chamber, with the magazine chamber preferably leading into the coating chamber. The pieces provided for ablation one after the other can be arranged in many different ways. It is particularly expedient for the pieces to be arranged in a turning magazine which makes it possible to bring the pieces one after the other into a target position for the ablation.

To achieve as high storage density as possible in the turning magazine, provision is made for the pieces to be aligned parallel to one another in the turning magazine.

Furthermore, provision is made in an advantageous variant of the inventive solution with a turning magazine for the turning magazine to be recharged with the pieces so that, for example, during the ablation of one piece from the turning magazine, the turning magazine can be recharged with another piece.

An inventive solution in which the turning magazine is seated in a magazine chamber is particularly expedient.

It is particularly advantageous for several magazine chambers to be provided so that, for example, a piece from one magazine chamber can be ablated while the other magazine chamber is separated from the coating chamber and recharging of the turning magazine in it can be carried out.

Accordingly, when several magazine chambers are provided, a solution is preferably selected according to which at least one piece from a magazine chamber is ablated while, in particular, in the magazine chambers separated in a vacuum-tight manner from the coating chamber pieces used up by ablation are replaced. When targets in the form of pieces are used, it has proven particularly expedient for the pieces to extend in the direction transverse to the direction of movement of the continuous strip, and it is particularly advantageous for the pieces to extend in this direction over the entire continuous strip.

In this case, it is preferable for the pieces to be acted upon simultaneously by several laser beams and for several ablation regions to be thereby created. As an alternative or supplement to this, it is, however, also possible to provide a solution in which the ablation region travels due to relative movement between the piece to be ablated and the laser beam, and, in the simplest case, the ablation region will travel over the entire width of the continuous strip.

In the simplest case, the relative movement is likewise achievable by movement of the laser beam relative to the stationary piece. It is, however, also conceivable for the relative movement to be carried out by movement of the piece relative to the stationary laser beam.

In all cases, it is particularly advantageous for the travel of the ablation region to be used for uniform removal of the coating material from the piece.

In all of the embodiments described hereinabove, it was not specified whether the coating material provided in the form of the target is to be used to build up the coating or whether this coating material is to first undergo change. In a preferred embodiment in which, in particular, coatings consisting of metals are applied to a continuous strip, provision is made for the atoms or molecules of the ablated coating material to build up the coating on the flat material without undergoing a chemical reaction in the coating particle stream.

As an alternative to this, it is, however, also possible, in particular for the building-up of ceramic coatings, to allow the atoms or molecules of the ablated coating particle stream to react with a reaction gas penetrating the latter to form a chemical compound forming at least part of the coating on the flat material, in which case, the reaction rate and reaction readiness of this reaction have to be taken into consideration. It is, for example, not possible to carry out this reaction with special ceramic materials and so these are also ablated as solid, already existing compounds and applied to the flat material without undergoing chemical change in the compound particle stream.

In the embodiments described hereinabove, it was only explained that uniformity of the coating, in particular, of the thickness thereof, is achievable by movement of the coating particle stream relative to the flat material.

In a further preferred embodiment, however, provision is made for the coating particle stream to be additionally acted upon on its way between the ablation region and the flat material in order to reduce the coating particle stream density gradient in this coating particle stream. A particularly simple way of acting upon the coating particle stream is for it to be acted upon by further particles.

These further particles can be of any chosen kind. It is, however, particularly advantageous for the further particles to be gas particles.

The further particles are preferably introduced in the form of a particle stream striking the coating particle stream.

In the simplest case, this is solved by the additional particle stream crossing the coating particle stream.

As an alternative or supplement to this, it is, however, also conceivable for the further particles to be introduced in the form of a particle cloud which is essentially moved along with the flat material.

Uniformity of the coating particle stream density is preferably achieved by the coating particle stream interacting with the further particles by means of collisions.

Provision is expediently made for the coating particle stream to bring about on its way from the ablation region to the flat material on average at least approximately one collision with the further particles. Therefore, the pressure to which the further particles are subjected is preferably selected accordingly so that the free paths for the coating particles lie in the order of magnitude of the spacing between the ablation region and the flat material. If a higher degree of interaction is desired, it is possible, in accordance with the invention, to go up to on average approximately ten collisions with the further particles by increasing the pressure.

In particular, in order to additionally achieve improved uniformity in the direction transverse to the continuous strip, provision is made for the further particle stream to be moved with a component in the direction transverse to the direction of movement of the continuous strip and for the coating particle stream to be moved along in the transverse direction by this movement.

In addition, provision may be made for the further particle stream to have a flow component in the direction of passage or in the direction opposite to the direction of passage of the continuous strip.

In the simplest case, provision is made for the further particle stream to be an inert gas current. .In this case, no reaction should take place between the coating particles of the coating particle stream.

However, in particular when a ceramic coating is to be applied to the continuous strip, it is also conceivable for the further particle stream to be a reactive gas current so that, on the one hand, this reactive gas current contributes to uniformity of the coating particle stream density gradient and, on the other hand, owing to the reactive gas current, chemical reactions take place with the coating particles to form chemical compounds which then become at least part of the coating which builds up on the continuous strip.

Hereinabove it was merely explained that uniformity of a coating particle stream density gradient is to be brought about.

With additional particles, it is, however, also possible to bring about a velocity moderation of the coating particles in the coating particle stream by the further particles.

Herein it is particularly expedient for at least partial thermalization of the velocity of the coating particles in the coating particle stream to be carried out by the further particles. This has the great advantage that the very rapid particles in the coating particle stream are braked and hence do not strike the flat material at too great a speed, which contributes towards better and firmer formation of the coating growing on the flat material, whereas too rapid particles remove particles again from the coating which has already been built up or from the flat material.

A further possible way of acting on the coating particle stream is for the coating particle stream be acted upon by a gas discharge.

Provision is preferably made for the gas discharge to be a glow discharge.

This glow discharge is expediently maintained by means of further discharge particles, and provision is preferably made for the further discharge particles to interact with the coating particle stream.

The interaction of the further discharge particles is preferably brought about by collisions with the stream of coating material.

In particular, to be able to work at low pressures, provision is made for the glow discharge to be stabilized by a magnetic field. This magnetic field has the advantage that the electrons are guided in a circle and, therefore, in spite of the large free path length of the electrons a significant number of collisions are carried out by the electrons.

Furthermore, provision is made in a preferred embodiment of the invention for the glow discharge to be stabilized by the supplying of discharge particles. The supplying of discharge particles would, for example, be the supplying of a gas.

It is, however, quite adequate for the glow discharge to be stabilized by the electrons which are released during the laser ablation. These electrons can, for example, be made use of by applying a field extending from the ablation region as cathode to an anode, with one or several anodes preferably being arranged at the side of the coating particle stream.

The coating particle stream is preferably acted upon by the coating particle stream entering the glow discharge transversely to the direction of movement of the discharge particles.

In another embodiment, provision is made for the coating particle stream to enter the glow discharge essentially in the direction of movement of the discharge particles and to continue in the glow discharge.

Initially, interaction preferably occurs in the glow discharge in the same way as with a normal gas, i.e., moderation of the velocity of the discharge particles is brought about by collision interaction.

In addition, the collisions between the coating particles and the electrons result in a further ionization of the coating particles which in the form of ions are then also subjected to the actions of the electric field in the glow discharge. This additional ionization of the coating particles has the further advantage that all of the ions moving in the direction towards the flat material are accelerated, in the cathode case, immediately before the cathode essentially in accordance with the voltage drop in the cathode case and, therefore, the total number of ions has an essentially constant velocity at which these strike the coating which is building up.

In the cathode case, the ions receive an energy of several 100 eV which is substantially higher than the energy of the ablated neutral particles and improves the coating growth and the adhesive characteristics of the coating as a greater amount of energy is available to the particles in the developing plasma to achieve the desired spatial arrangement of these particles in the coating.

A further possibility of acting on the coating particle stream is for the coating particle stream to be acted upon by radiation.

One embodiment of radiation action would be the acting on the coating particle stream by means of electromagnetic radiation, another alternative or supplement would be the acting on the coating particle stream by means of electron radiation.

With the possibilities for acting on the coating particle stream, such action on the coating particle stream as brings about a decrease in the coating particle stream density gradient selectively by means of radiation has priority.

Here, for example, selective heating-up of the coating particle stream to balance out the coating particle density gradient comes to mind.

A further alternative is that of acting upon the coating particle stream by means of an ion current, with the ion current being held in a defined direction by guidance in an electric or magnetic field.

Aside from acting on the coating particle stream to balance out the coating particle stream density, it is similarly advantageous for the coating particle stream to be additionally acted upon on its way between the ablation region and the flat material to reduce energy differences between the coating particles.

Here it is advantageous for the coating particle stream to be acted upon by an ion current, preferably from a glow discharge. Advantageous possibilities for arranging and stabilizing the glow discharge as well as the effects achievable with the glow discharge have already been explained hereinabove. Another possibility is for the coating particle stream to be acted upon by radiation, with electromagnetic radiation or electron radiation being preferred.

Furthermore, within the scope of the inventive solution it is advantageous for the coating to be acted upon by high-energy particles during this growth on the flat material to improve the coating characteristics, preferably for the adhesion and density of the coating.

Herein it is particularly expedient for the coating which is building up to be acted upon by ion bombardment. These ions can come, for example, from an ion gun. Another possibility for ion bombardment of the coating which is building up is for the ions to come from a gas discharge—in particular a glow discharge—and/or from the coating particle stream and in the cathode case of the gas discharge to be accelerated in the direction of the coating. Here re-ionization of the coating particle stream is particularly advantageous in order to increase its ionic concentration.

A third possibility is for the coating to be acted upon by electrons.

In the inventive solution, all high-power lasers are usable, in particular, CO lasers, Nd YAG lasers, excimer lasers, free electron lasers or also semiconductor lasers.

Depending on the power density, the component of droplets, clusters and atoms in the coating particle stream can be varied.

Therefore, in one possibility for carrying out the process, provision is made for the power density of the laser beam in the ablation region to be selected such that the coating particle stream preferably comprises droplets, clusters and atoms, with power densities in the order of magnitude of $10^5$ to $10^8$ W/cm$^2$ being expedient.

In another possibility for carrying out the process, provision is, therefore, made for the power density of the laser beam in the ablation region to be selected such that the coating particle stream preferably comprises excited atoms and ions, with power densities of the order of magnitude of greater than $10^8$ W/cm$^2$ being expedient.

In one embodiment, the lasers used are operated continuously.

Another expedient embodiment, however, makes provision for pulsed lasers, expediently with pulse durations of less than 100 $\mu$s, and even more expediently, less than 1 $\mu$s.

In an expedient embodiment, the pulses are of such configuration that the ablation is introduced with part of the pulse initially having a high power density and reionization of the coating particles in the coating particle stream takes place subsequently with lower power density.

One particularly advantageous way of carrying out the coating process within the scope of the invention makes provision for the flat material to be heated when, for example, crystalline layers are to be produced. This can be carried out prior to or during the coating procedure, for example, conductively, inductively, via infrared radiation, by glow discharge, by bombardment with laser, plasma, electron or ion beams or by means of hot gases.

On the other hand, when, for example, amorphous layers are to be produced, it is advantageous to cool the flat material for the coating, and this can likewise be carried out prior to or during the coating.

Furthermore, with the inventive process, heating or cooling of the target is advantageous in order to thereby influence the ablation process and the kind of the particles in the coating particle stream.

In the above description of the performance of the inventive process and the design of the inventive device, no details were given about how the continuous strip is to be guided in the coating chamber.

For stabilization of the pressure in the coating chamber, provision is made for the continuous strip to be guided through a lock before and after the coating chamber.

Furthermore, provision is preferably made for the continuous strip to be guided in a non-contacting manner in the coating chamber.

When a physical pretreatment unit is provided, provision is, furthermore, preferably made for the continuous strip to be guided in a non-contacting manner through a lock between the physical pretreatment unit and the coating chamber.

In all these statements on the inventive process, it was mainly only explained how the coating of the continuous strip is to be carried out. No details were given about how the entire process is to be performed.

Accordingly, within the scope of the inventive solution it is particularly advantageous for the continuous strip to be produced by a mechanical unit for providing the continuous strip and for this unit to unwind rolls of strip material one after the other and join the end of one roll to the start of the other roll.

Furthermore, for performance of the inventive process it is advantageous for the mechanical unit for providing the continuous strip to be followed by a device for storage of the strip. The purpose of this device for storage of the strip is to provide for a constant passage speed in the inventive process, whereas with the unit for providing the continuous strip, stoppage of the strip feed is always necessary for the joining of two rolls respectively.

Furthermore, it is advantageous for the continuous strip to pass through a chemical pretreatment unit before it is coated with substrate material.

Herein it is expedient for the chemical pretreatment unit to comprise an alkaline degreasing unit.

Furthermore, it is advantageous for the alkaline degreasing unit to comprise spray degreasing.

The alkaline degreasing unit preferably comprises electrolytic degreasing.

Moreover, it is expedient for the electrolytic degreasing to follow the spray degreasing.

It is also expedient for the electrolytic degreasing to be separated from the spray degreasing by a brush machine.

In addition, it is expedient for cascade rinsing to be provided at the end of the alkaline degreasing unit.

A further advantage is obtained by the cascade rinsing being preceded by a brush machine.

It is particularly advantageous within the scope of the inventive solution for the chemical pretreatment unit to comprise acidic pickling.

It is expedient for the acidic pickling to follow the alkaline degreasing unit.

In particular, the acidic pickling is designed. so as to comprise an electrolytic zone.

Furthermore, it is expedient for the electrolytic zone to be followed by cascade rinsing.

Finally, it is expedient for the cascade rinsing to be preceded by a brush machine.

Moreover, it is advantageous for the chemical pretreatment unit to comprise a drier at the end.

In addition to a chemical pretreatment unit, it is, furthermore, expedient for a physical pretreatment unit to be provided.

It is expedient for the physical pretreatment unit to follow the chemical pretreatment unit.

Herein it is expedient for the physical pretreatment unit to comprise a degasification unit with which all of the atoms or molecules adsorbed on the continuous strip can be removed.

The degasification unit is expediently of such design that in it, in order to promote the desorption, the continuous strip is heated up and/or subjected to electron bombardment and/or ion bombardment and/or plasma radiation and/or laser light and/or UV light.

In all, the degassing procedure is promoted by the molecules adsorbed on the continuous strip being provided with energy by the above-mentioned measures, in particular, heated up, and by the desorption thereby being furthered.

In order to maintain the pressure in the degasification unit, the latter is expediently preceded and followed by a lock. Furthermore, it is advantageous for the physical pretreatment unit to comprise a preheating unit.

Heating-up of the continuous strip is expediently carried out in the preheating unit in an inert gas atmosphere.

It is particularly advantageous for the physical pretreatment unit to comprise a physical activation unit.

This physical activation unit should preferably follow the degasification unit.

Furthermore, provision is made for the preheating unit to be arranged between the degasification unit and the physical activation unit.

Here it is advantageous for the physical activation unit to be preceded by a lock.

It is particularly expedient for activation of the flat material to be carried out in the physical activation unit by electron bombardment and/or ion bombardment and/or bombardment with plasma beams and/or bombardment with laser light and/or bombardment with UV light.

It is particularly expedient for the pressure in the physical activation unit to be of the same order of magnitude as the pressure in the coating chamber. In a particularly preferred embodiment, provision is made for the ion bombardment in the physical activation unit to be carried out by a glow discharge.

In particular, to be able to go to low pressures, it is expedient for the glow discharge to be stabilized and supported by a magnetic field.

In addition, further support of the glow discharge is achievable by it being supported by thermally emitted electrons in an auxiliary current circuit, for which purpose, for example, anodes are to be arranged at the side of the coating particle stream.

The pressures at which the glow discharge takes place are preferably selected so as to lie between $10^{-2}$ and $10^{-3}$ bar.

In a special embodiment of the inventive solution, provision is made for the glow discharge to be generated by yoke-shaped anodes.

Coils for generating the magnetic field are preferably also arranged in the yoke-shaped anodes.

In a particularly expedient configuration, the yoke-shaped anodes are of pot-shaped design and they are preferably arranged with their open side facing the continuous strip.

As far as the material is concerned, it is advantageous for the yoke-shaped anodes to be made of a magnetizable material so that the flux of the magnetic field can run partly through the yoke-shaped anodes and, in particular, the yoke-shaped anodes serve as shield for the magnetic field.

In order to improve the physical activation, provision is preferably made for the physical activation unit to comprise several activation chambers.

The activation chambers are expediently shielded off from one another.

In a particularly preferred process according to the inventive solution, provision is made for the flat material to be guided in the vertical direction through the coating chamber. This has the advantage that all heavy particles, for example, clusters, fall out of the coating particle stream and do not strike the coating that is growing up. Furthermore, there is also the danger that during the ablation larger particles which do not travel in the coating particle stream in the direction towards the continuous strip will become detached, and with vertical guidance of the flat material, these do not settle in the coating.

To maintain the pressure in the coating chamber, provision is advantageously made for the flat material to pass before the coating chamber and after the coating chamber through a pressure lock.

As an alternative to the solution described hereinabove in which the physical pretreatment, in particular the physical activation, is carried out separately from the coating procedure and hence also separately from the coating chamber, provision is made in a further, in particular structurally more simple solution, for the physical pretreatment to be carried out before the coating procedure in a pretreatment chamber which is not separate from the coating chamber.

After termination of the coating, provision is made in a preferred way of conducting the inventive process for physical aftertreatment of the coating to be carried out, in particular, for the coated continuous strip to be kept at a favorable temperature.

The physical aftertreatment may, for example, serve to allow thermal reactions to take place with the base material.

Furthermore, it is advantageous for the physical aftertreatment to be simultaneously or subsequently supplemented by a chemical aftertreatment.

For example, a reaction gas atmosphere, in particular supported by a glow discharge, is expedient to allow a reaction to take place with the coating.

However, advantageous chemical aftertreatments such as carbonization or nitrogenization are also chemical reactions with the coating.

Furthermore, cooling of the coated continuous strip is expediently carried out after the physical aftertreatment, and prior to the cooling, measurement of the coating characteristics, for example, measurement of the thickness of the coating can be carried out by a measuring head movable transversely over the coated continuous strip.

Owing to the high energy density of the laser beam, each element is, in principle, evaporatable and hence potentially suitable for coating with the inventive process and the inventive device. Also all combinations of elements are conceivable and so the range of coating materials is practically unlimited. Furthermore, with the inventive coating there is an almost unlimited potential as far as the coating build-up and the coating possibilities are concerned. For example, both electrically conductive and non-conductive coating materials are usable, such as pure metals, alloys, ceramic layers, such as oxides, carbides, nitrides, borides, carbonitrides, silicates and similar substances.

It is particularly advantageous within the scope of the inventive solution to build up double and multiple coatings.

In accordance with the invention, it is also possible to produce coatings with concentration gradients by regulating the mixing proportions of several coating materials.

A special advantage of the inventive solution is also the production of different coatings on different sides of the flat material, and type, build-up and purpose of the coatings can be chosen differently.

Furthermore, with the present invention it is particularly advantageous to carry out selective coatings in the transverse direction, i.e., the width of the continuous strip and also in the direction of passage, with, for example, either precisely directed coating particle streams or appropriately designed masks being usable for this purpose.

Furthermore, a great advantage of the inventive solution is to be seen in the fact that—if desired, for example, for cost reasons—coatings can be carried out in a very simple way on one side.

The main purpose for which today's conceivable metal and alloy coatings are used is corrosion protection. The fields of use are primarily the automobile, household appliance and building industries. However, other characteristics are also of great importance for the processing, such as workability, coating adhesion, weldability of the final product, adhesiveness of the final product, ability to be phosphatized and painted as well as the optical appearance of the final product.

With the process according to the invention not only a considerable development and improvement of the anticorrosive characteristics of the coatings is achievable but also better optimization with respect to the entire range of requirements, for example, the aforementioned characteristics for special fields of use. For example, a ZnMg alloy coating with substantially improved anticorrosive characteristics can be produced with the process according to the invention.

Furthermore, the process according to the invention enables a qualitatively improved coating build-up which, in turn, results in a reduction of the coating thickness and thus in an improvement of the reshapeability and weldability of the coating composite with the same and even improved corrosion-resisting quality.

The manufacture of colored, decorative coatings which, for example, may substitute enamel coatings is likewise possible in a simple way with the process according to the invention.

In addition to steel, all metals producible in strip form, in particular also aluminum, are, in principle, conceivable as material for the flat material.

A further considerable advantage of the inventive process with respect to the process technology is its flexibility. It is possible to change the coating material in a simple way by exchanging the target. Also, there is no necessity for setting up an inventive device for special coating systems and so one and the same inventive device is usable for very different coatings.

Further features and advantages of the inventive solution are the subject matter of the following description and the illustration of several embodiments. The drawings show:

BRIEF DESCRIPTION OF THE DRAWINGS

FIGS. 1A, 1B, 1C, 1D and 1E are schematic illustrations of a process according to the invention;

FIG. 2 an enlarged illustration of an embodiment of a physical pretreatment unit;

FIG. 8 a possibility for the relative movement between the coating particle stream and the flat material;

FIG. 9 an illustration of the distribution of the coating particle stream density (d) relative to the radius (r);

FIG. 10 a further possibility for the coating of the flat material over the entire width;

DETAILED DESCRIPTION OF THE DRAWINGS

Figures 1A, 1B:
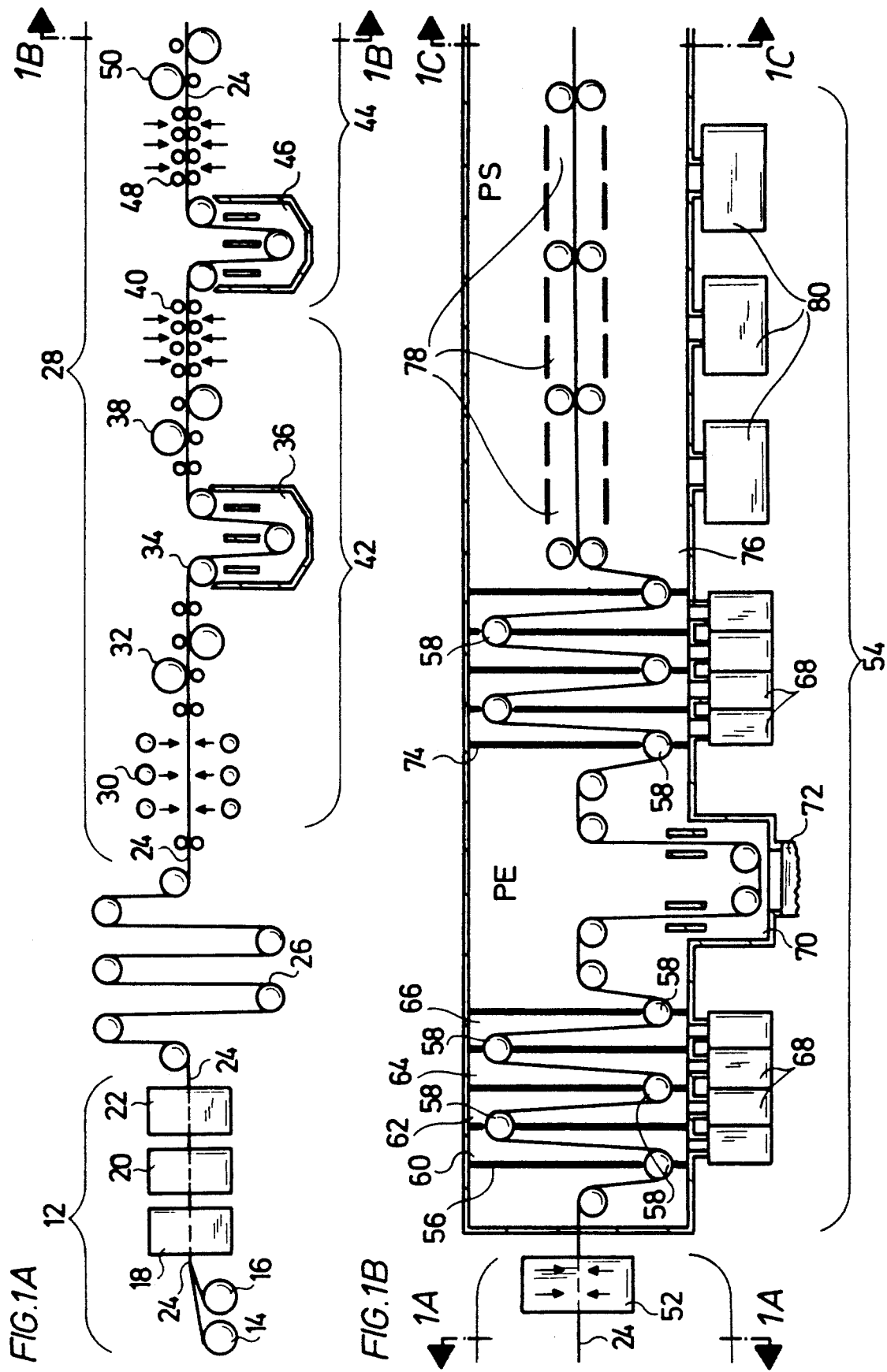
Figures 1D, 1E:
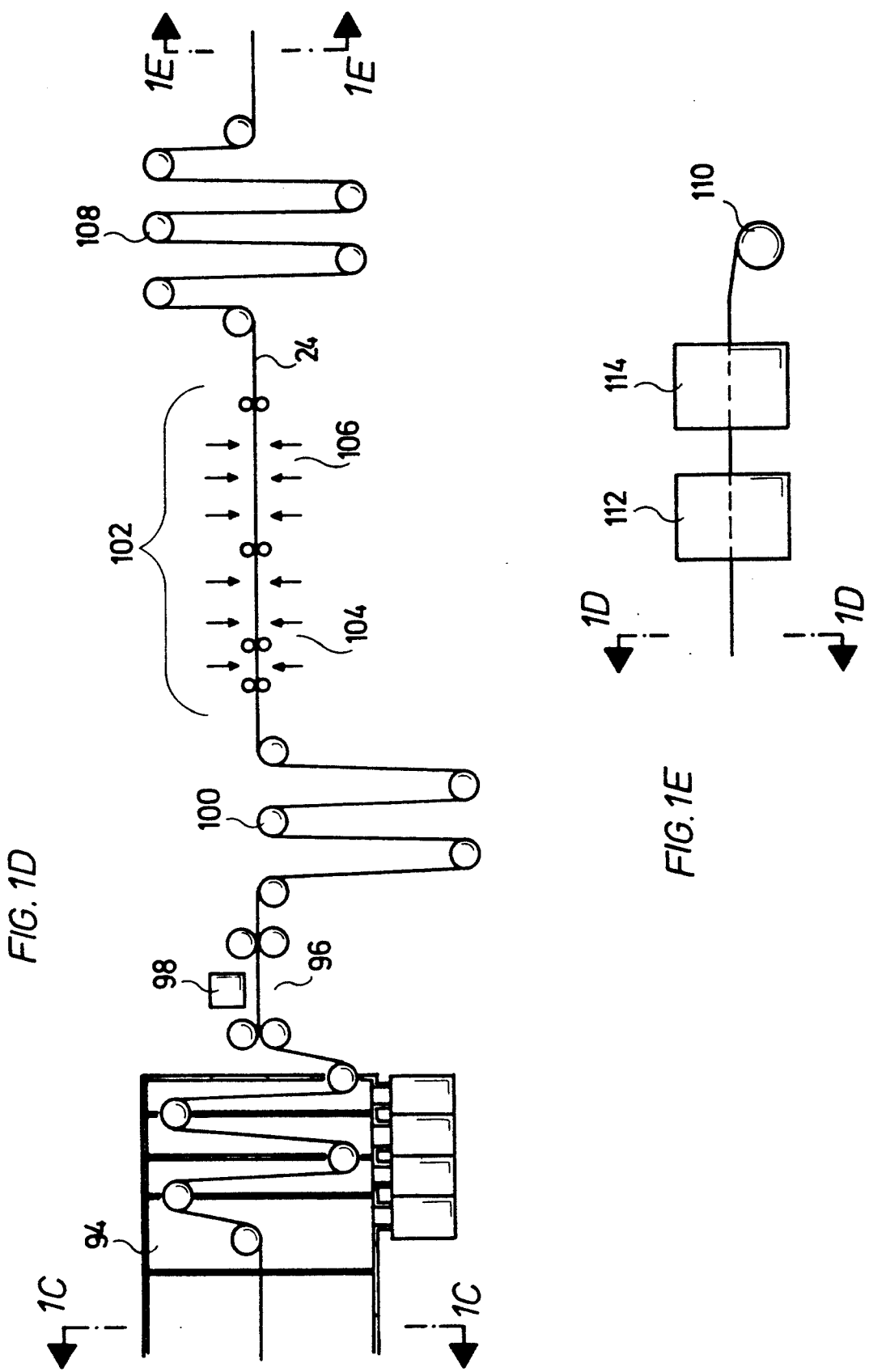

An embodiment of a process according to the invention, illustrated in FIG. 1, comprises several units.

Flat material wound on a roll 14 is first drawn up in a mechanical unit 12 for providing the continuous strip by unwinding the roll and introduced into the process. An end of the previous flat material is cut off with scissors 18, the start of flat material wound on a roll 16 is then fed into the scissors 18 and cut off by these so that the start of the flat material wound on the roll 16 can be welded to the end of the flat material wound on the roll 14 in a welding machine 20 to form a continuous strip 24. This process is constantly repeated so that a coherent continuous strip 24 passes through the entire process according to the invention.

To improve the evenness of the continuous strip, the mechanical unit 12 for providing the continuous strip is preferably also provided with a unit 22 for stretching and levelling flexures. After this unit 22 for stretching and levelling flexures, the continuous strip 24 leaves the mechanical unit for providing the continuous strip and enters a device 26 for storage of the strip. This device 26 for storage of the strip is designed as a vertical or horizontal device for storing the strip and separates the unit for providing the continuous strip from the following process. The device 26 for storage of the strip serves to compensate the interruptions in the feed when the end and the start are being welded together by the welding machine so that after the device 26 for storage of the strip, the continuous strip 24 travels through the process according to the invention at a constant speed.

A first stage of the process according to the invention takes place in a chemical pretreatment unit 28. This chemical pretreatment unit serves to clean and chemically activate the continuous strip for the subsequent coating.

The chemical pretreatment unit first comprises spray degreasing 30 during which fat-dissolving chemicals are applied to the continuous strip.

The spray degreasing 30 is followed by a brush machine 32 which is then followed by electrolytic degreasing 34 in the course of which the continuous strip 24 is drawn through a degreasing bath 36. The electrolytic degreasing is followed by a further brush machine 38 which is followed by cascade rinsing 40. The cascade rinsing, 40 is preferably designed in several stages and rinses the continuous strip with water.

The spray degreasing 30 with the brush machine 32, the electrolytic degreasing 34, the brush machine 38 and the cascade rinsing 40 together form an alkaline degreasing unit 42.

This alkaline degreasing unit 42 is followed by acidic pickling which is designated in its entirety 44 and comprises an electrolytic zone 46 followed by cascade rinsing 48 and a final brush machine 50.

The chemical pretreatment unit 28 is terminated by drying 52 from which the continuous strip 24 is fed in the dry state following the complete chemical pretreatment to a physical pretreatment unit 54.

At the beginning of the physical pretreatment unit, the continuous strip 24 is surrounded by atmosphere at normal pressure. In a lock 56, the continuous strip is, therefore, first drawn in zig-zag configuration by deflection rolls 58 through several lock chambers 60, 62, 64 and 66, each lock chamber being in communication with a vacuum pump 68 and the pressure surrounding the continuous strip 24 in the lock chambers 60 to 66 being reduced one after the other to a negative pressure PE in a degasification unit 70 following the lock 56. The degasification unit 70, for its part, is likewise connected to a vacuum pump 72. In this degasification unit 70, all of the particles, in particular atoms or molecules, adsorbed by the continuous strip 24, in particular on its surface, are desorbed and sucked off by the vacuum pump 72.

To promote the desorption, the degasification unit preferably also includes treatment of the continuous strip 24 in which it is either heated up and/or subjected to electron bombardment and/or ion bombardment and/or plasma radiation and/or laser light and/or UV light. With this supply of energy, as complete detachment as possible of all of the particles adsorbed by the continuous strip 24 is achieved. The adhesive strength of a coating later applied to this continuous strip 24 is thereby improved.

Following the degasification unit 70, the continuous strip 24 is drawn through a further lock 74 which is of exactly the same design as the lock 56 but serves to separate an inert gas atmosphere 76 in a preheating unit 78 from the degasification unit.

Heating-up and preheating of the continuous strip 24 take place in this inert gas atmosphere 76, for example, via jet pipes aimed at the continuous strip 24, and/or inductive heating-up of the continuous strip 24 and/or heating-up by infrared radiators and/or electron beams and/or plasma beams.

However, the inert gas atmosphere 76 is also kept at a certain pressure PS by pumps 80 during the preheating of the continuous strip 24.

The preheating unit 78 is, furthermore, separated by a lock 82 from a physical activation unit 84. The lock 82 is, in principle, of exactly the same design as the locks 56 and 74 and so reference is to be had in this connection to the statements thereon.

The physical activation unit 84 serves to remove the physically or chemically adsorbed particles still adhering to the continuous strip 24 after the degassing and to thereby provide a highly active surface which is the precondition for a well adhering coating. The physical activation is necessary particularly when hard ceramic coatings are applied.

Activation of the continuous strip can be carried out in the physical activation unit 84 by electron bombardment and/or ion bombardment and/or bombardment with plasma particles and/or bombardment with laser light and/or bombardment with UV light. All of these possibilities serve to remove the adsorbed particles from the continuous strip 24 by the direct supplying of energy. A preferred embodiment of one inventive possibility of physical activation is described in detail hereinbelow.

The physical activation unit is followed by a lock 86 which separates the physical activation unit 84 from the coating unit 88. A desired coating is applied to the continuous strip 24 in the coating unit. This coating can be applied to one side or to both sides.

The coating unit is described in detail in several embodiments hereinbelow.

The coating unit 88 is followed by a lock 90 so that the pressure in the coating unit can be selected by the locks 86 and 90 preceding and following it, respectively, in accordance with the requirements for the respective coating without taking into consideration the units preceding and following it.

The lock 90 is followed by a physical aftertreatment unit 92 in which the continuous strip with the coating applied to it is kept at its temperature or undergoes intermediate cooling. A measuring device 96 follows this physical aftertreatment unit and is separated from it by a lock 93. Herein exact detection of the coating applied is carried out by a measuring head 98 crossing the continuous strip widthwise. Preferably, both the composition and the thickness of the coating are measured.

After passing through the measuring device 96, the continuous strip 24 is conducted through a cooling unit 100 in which the continuous strip 24 is cooled down to the desired temperature by air and/or water cooling.

The cooling unit 100 may be followed by a chemical aftertreatment unit 102 which preferably includes phosphatization 104 and subsequent chromate rinsing 106.

The chemical aftertreatment unit 102 is followed by a device 108 for storage of the strip which likewise serves to ensure that the continuous strip travels at a constant speed between the strip storage device 26 and the strip storage device 108. After the device 108 for storage of the strip, the continuous strip is wound up again in a winding-up device 110 which is preceded by a lubricating machine 112 with scissors 114 arranged between the latter and the winding-up device 110. The continuous strip can be cut off with the scissors 114 and hence wound up into individual rolls of a certain size.

An embodiment of the physical activation unit 84, illustrated in FIG. 2, comprises several successive activation chambers 120, 122 and 124 which the continuous strip 24 passes through one after the other. Each of these activation chambers is connected to a vacuum pump 126, 128 and 130 serving to generate the respective pressure PA in the respective activation chamber 120, 122 and 124.

Each activation chamber contains an anode 132 at a voltage of, for example, 300 to 2000 volts in relation to the cathode formed by the continuous strip 24 or flat material.

This brings about a glow discharge between the anode 132 and the continuous strip serving as cathode, whereby the continuous strip 24 or flat material is subjected to ion bombardment.

To make the pressure PA in the activation chamber as equal as possible to the pressure of the coating unit 88 following the activation unit 84, a magnetic field whose field lines 134 extend essentially perpendicular away from the continuous strip 24 or flat material is preferably also provided for supporting the glow discharge.

The anodes 132 are preferably of yoke- or pot-shaped design and comprise a yoke bar 136 extending essentially parallel to the continuous strip 24 and two yoke legs 138 arranged at the end of the yoke bar 136 and pointing in the direction towards the continuous strip 24 and terminating at a short distance from the continuous strip 24. A coil 142 serving to generate the magnetic field is arranged in a yoke interior 140 formed between the yoke legs 138 and the yoke bar 136. The coil 142 extends with its windings 144 preferably near the yoke legs 138. Towards the yoke interior 140 the coil 142 is provided with a protective covering 148.

The glow discharge extends, supported by the field lines 134, preferably in the interior of the yoke-shaped anode 132, preferably within the coil 142 and between the yoke bar 136 and the region of the flat material or continuous strip 24 opposite it. The anode 132 is of such dimensions that the glow discharge extends over the entire width of the continuous strip 24 transversely to the direction of travel.

The anode 132 is expediently held by an insulating holder 150 in the respective activation chamber 120, 122 or 124.

To obtain physical activation of the continuous strip 24 on both sides thereof, such an anode 132 is preferably arranged on opposite sides of the continuous strip 24 so that a glow discharge is generated between the anodes 132 and the continuous strip 24 on both sides of the continuous strip 24.

To achieve as effective activation of the continuous strip 24 as possible, each of the activation chambers 120, 122 and 124 is provided with anodes 132 arranged on opposite sides of the continuous strip 24.

The physical activation is preferably carried out with a pressure of between $10^{-2}$ and $5 \times 10^{-4}$ mb at voltages between the respective yoke 132 and the continuous strip 24 of approximately 200 to approximately 2000 V.

A first embodiment 88a of the coating unit 88 comprises a coating chamber 160 through which the continuous strip 24 is conducted. Pairs of rollers 162 and 164 spaced from one another are provided for guiding the continuous strip. Between these pairs of rollers 162, coating material is ablated from a target 168 by a laser beam 166 and then propagates in the form of a coating particle stream 170 in the direction towards the continuous strip 24 and deposits in the form of a coating 172 on this continuous strip.

Round bar stock 174 is preferably chosen as target 168 and is irradiated by the laser beam in such a way that an ablation region 176 in which the coating material is ablated lies at the end face of the round bar stock 174.

The round bar stock 174 is fed, for example, in a feeding direction 178 standing perpendicular on the flat material or continuous strip 124 with the axis of the round bar stock extending in this feeding direction 178.

The round bar stock 174 enters the coating chamber 160 through a feed lock 180 from outside the coating chamber 160.

The round bar stock 174 is fed by a feeding device 182 which advances the round bar stock in such a way that the ablation region 176 is always at the same distance from the continuous strip 24 and hence also stops stationary relative to the coating chamber 160. This makes it necessary for the feeding device 182 to constantly advance the round bar stock 174 in such a way that the entire round bar stock 174 is removed in the ablation region 176.

A device 184 for making ready the round bar stock 174 is also provided beside the feeding device 182. This ensures that the round bar stock 174 is fed as continuous bar to the coating unit 88 and, for this purpose, for example, joins round bar stock of limited length to form the continuous round bar stock 174, in the simplest case, by welding or adhesively joining the round bar stock.

In the simplest case, the ablation of the coating material on an end face 190 of the round bar stock 174 is carried out by the laser beam 166 being focused on a focus spot 192 such that the focus spot 192 covers the entire surface of the end face 90 of the round bar stock 174 and ablation of coating material thus occurs on the entire end face 190 thereby forming the coating particle stream 170.

Figure 4:
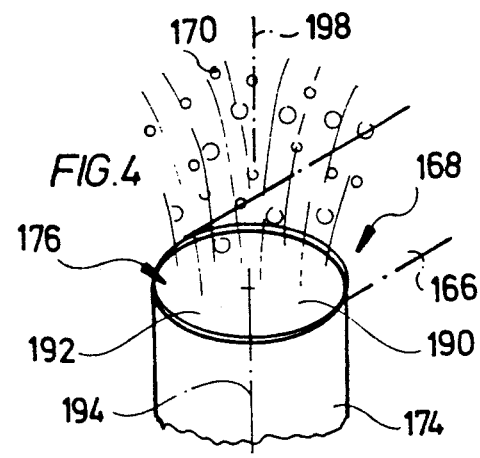
FIG. 4 a partial illustration of a first possibility for the ablation.

However, this is only possible when the round bar stock 174 has a small cross-sectional area. These relations are shown in FIG. 4.

If, however, for example, for reasons of the quantity of coating material to be supplied, a thicker round bar stock 174' has to be used, its end face 190' is substantially larger than the focus spot 192 which still has a sufficiently high energy density to achieve ablation of the coating material. These relations are shown in FIG. 5.

If the thickness of the round bar stock 170' is large enough for the focus spot 192 to extend over at least a radius of the end face 190' provision is made in an advantageous version of the inventive solution for the round bar stock 174' to be allowed to rotate about its axis 194 so that the focus spot 192 travels over the entire end face 190' during one rotation of the round bar stock 174' and thus ensures uniform removal of the coating material.

Figure 6:
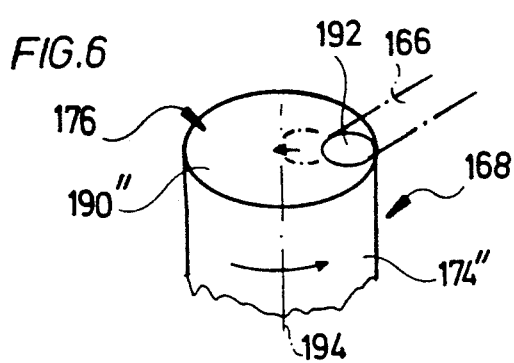
FIG. 6 a partial illustration of a third possibility for the ablation.
Figure 7:
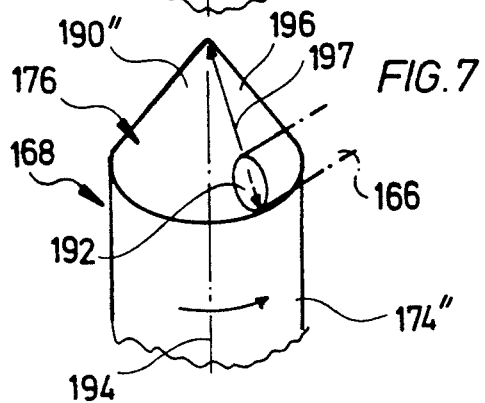
FIG. 7 a partial illustration of a fourth possibility for the ablation.

If, however, as illustrated in FIG. 6, the focus spot 194 is substantially smaller than the end face 190" of the round bar stock 174", uniform removal of coating material from the end face is likewise achievable by the focus spot, controlled by the laser optics, travelling over the end face 190" in accordance with a certain predetermined pattern, for example, by following a spiral line, and thus likewise ensuring uniform removal of the coating material from the end face 190".

Figure 5:
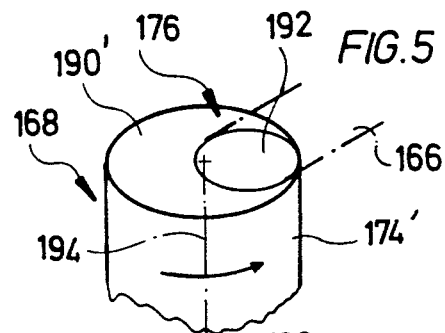
FIG. 5 a partial illustration of a second possibility for the ablation.

In contrast with the embodiments according to FIGS. 4 to 6 in which ablation is carried out in such a way that the end face 190 remains an essentially flat surface, it is, however, also conceivable for the round bar stock 174" to be ablated in such a way that, for example, it has a conical tip 196, in which case the focus spot 192 has to travel in a corresponding way on the conical tip 196 in order to maintain its shape. For this purpose, provision may be made, on the one hand, for rotation about the axis 194 and, for example, in addition, for travel up and down the conical tip in the direction of a circumferential line 198.

As an alternative to formation of a conical tip, it is, however, also conceivable to ablate a spherical cap-shaped or different type of round tip and to maintain this form by suitable movement of the focus spot 192 relative to the round bar stock 174.

Figure 3:
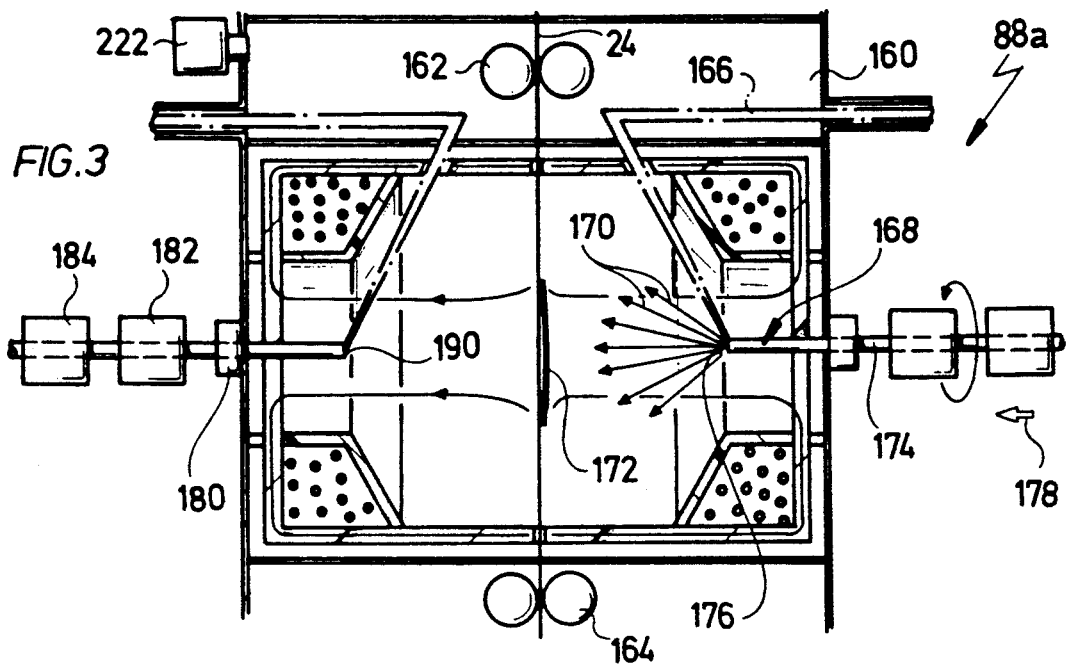
FIG. 3 an enlarged illustration of a first embodiment of a coating unit.

In the description of the embodiment according to FIG. 3, it was merely assumed that one side of the flat material or continuous strip 24 is acted upon by a coating particle stream 170. Such a coating particle stream ablated from the round bar stock 174 serving as target 168, seen in the radial direction from a center axis 198, has an uneven distribution of a coating particle stream density which is, for example, illustrated in FIG. 9.

Owing to this, when a uniform thickness of the coating 172 is to be achieved, it is not possible to act on the flat material 24 with only a stationary coating particle stream 170. As provided in FIG. 8, the target 168 is, therefore, preferably held in a displacement device 200 comprising a displacement guide means 202 and a displacement slide 204 which, for its part, carries the target 168. This displacement slide is movable in a transverse direction 206 preferably standing perpendicular to the direction of travel 208 of the continuous strip 24 and parallel to a surface 210 of the continuous strip 24 so that the target 168 is similarly movable in this transverse direction 206. Preferably, an oscillating movement in the transverse direction 206, for example, over the entire width of the continuous strip is chosen so that with simultaneous follow-up of the laser beam 166 with its focus spot 192, movement of the coating particle stream 170 relative to the flat material 24 likewise occurs in the transverse direction 206, the movement of the coating particle stream 170 preferably being selected such that the coating particle stream 170 extends in the points of reversal of the oscillating movement in the transverse direction 206 beyond a side edge 212. With this movement in the transverse direction 206, it is thus possible to form the average of the coating thickness resulting from the different coating particle stream density and thereby achieve altogether a coating 172 which has an essentially uniform thickness.

As an alternative to the device illustrated in FIG. 8, it is, however, similarly conceivable to arrange targets 168 spaced from one another, preferably targets 168 spaced at equal distances from one another, in the transverse direction 206 and to carry out ablation from these targets, the distances between the targets 168 in the transverse direction 206 being selected such that the sum of all of the coating particle streams 170 emanating from the respective ablation regions 176 has altogether on account of their overlapping an essentially uniform coating particle stream density over the transverse direction 206.

It is thus only necessary to move the continuous strip 24 in the direction of travel 208 relative to the plurality of coating particle streams overlapping one another.

As an alternative to the illustration in FIG. 10 in which the individual targets 168 are merely Spaced in the transverse direction 206, it is also possible to arrange successive targets in offset relation in the direction of travel 208 and in spaced relation in the transverse direction 206.

In the solution shown in FIG. 10, each ablation region is acted upon by a separate laser beam 166. In accordance with the invention, this is implemented, in the simplest case, by each laser beam coming from its own laser provided for this purpose. As an alternative to this, it is, however, preferably also conceivable for a single laser beam to be divided by beam dividers into different partial beams 166, with the different partial beams 166 preferably having essentially the same intensity.

A further advantageous solution makes provision for a pulsed laser to be used. Between two pulses this is switched on from one target 168 to the next so that there is no simultaneous ablation from all of the targets 168—as described in the foregoing—but instead successive ablation with respect to time. This solution is advantageous especially with high pulse frequencies.

Figure 11:
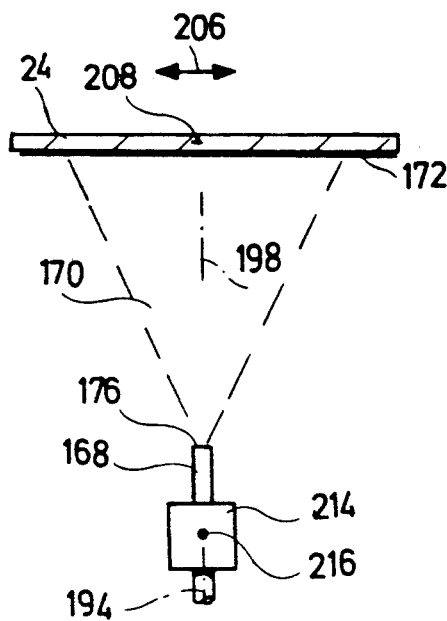
FIG. 11 a further possibility for the coating of the flat material over the entire width.
Figure 12:
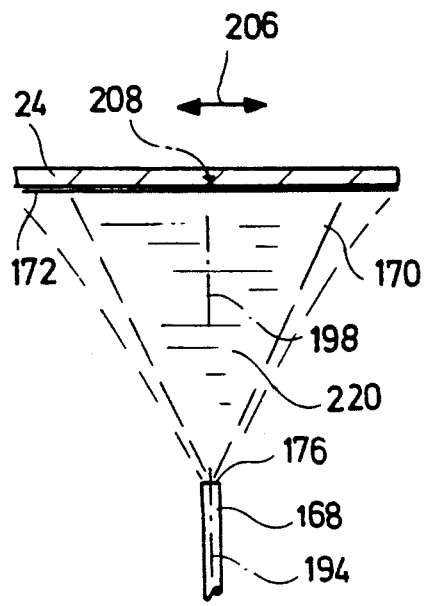
FIG. 12 a further possibility for the coating of the flat material over the entire width.

In a further embodiment illustrated in FIG. 11, the target 168 is held in a swivel device 214 which swivels the target 168 and also the laser beam 166 acting on its ablation region 176 about an axis 216 such that the coating particle stream 170 travels in the transverse direction 206 over the surface 210 of the flat material 24 over the entire width thereof and thus the uneven coating particle stream density is likewise determined.

A further inventive possibility for balancing out the coating particle density gradient prevailing in the uninfluenced coating particle stream 170 in FIG. 9 consists in allowing the coating particle stream 170 to enter on its way from the ablation region 176 to the flat material 24 a controlled gas atmosphere 220 so that even distribution is achieved by collisions of the coating particles with the gas atoms or molecules. This gas atmosphere preferably has a pressure of $10^{-5}$ to $10^{-4}$ Torr, whereby a propagation of the coating particle stream 170 which is essentially still directed towards the flat material 24 is obtained but owing to on average 0 to 1 collision with one atom or molecule of the gas atmosphere, the coating particles are diverted from their original direction and uniformly distributed. In particular with narrow flat material 24, i.e., with a short extent in the transverse direction 206, adequate balancing-out of the coating particle stream density gradient is achievable.

A pressure of the gas atmosphere 220 is preferably maintained by gas forming the gas atmosphere 220 being constantly introduced into the coating chamber 160 and by the gas constantly forming the gas atmosphere being pumped out of the coating chamber by a vacuum pump 222 (FIG. 3) connected to the coating chamber 160.

In the simplest case an inert gas is used to form the gas atmosphere 220. It is, however, also possible for a reactive gas to be used to form the gas atmosphere 220 if certain chemical combinations are to be formed between the particles of the coating particle stream and the gas atmosphere.

Figure 13:
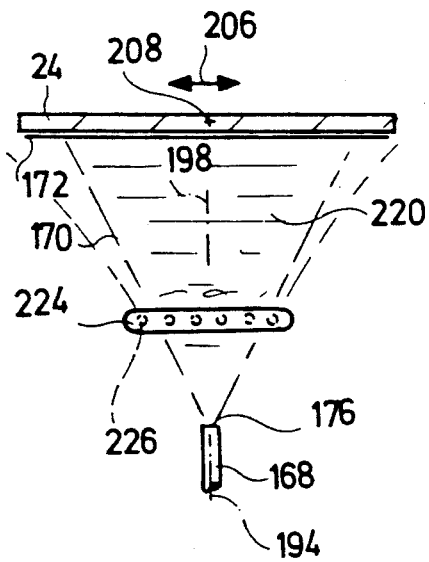
FIG. 13 a first possibility for introducing gas into the coating particle stream.

A highly advantageous possibility for generating such a gas atmosphere 220 between the ablation region 176 and the flat material 24, illustrated in FIG. 13, comprises a ring conduit 224 which surrounds the coating particle stream 170 and has nozzles 226 by means of which gas is blown in the direction of the coating particle stream 170, mixes with it so the gas atmosphere 220 forms in the coating particle stream 170 and around it and by means of collisions brings about a balancing-out of the coating particle stream gradient.

An even more comprehensive balancing-out of the coating particle stream density gradient is possible by increasing the number of the collisions and hence also by increasing the pressure of the gas atmosphere. For example, at pressures of $10^{-4}$ to $10^{-1}$ Torr, on average more than one collision occurs between a molecule of the gas atmosphere and a particle of the coating particle stream so that, in this case, the coating particle stream 170 propagates predominantly in a diffusion-controlled manner and, therefore, an aligned propagation of the coating particle stream 170 essentially no longer prevails.

Figure 14:
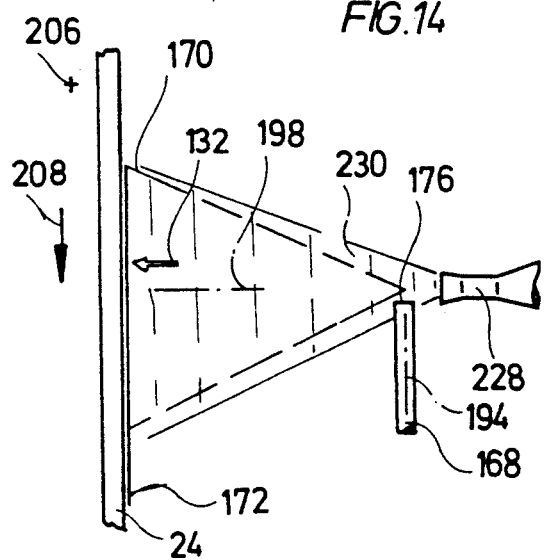
FIG. 14 a second possibility for introducing gas into the coating particle stream.

In a further inventive variant of an inventive solution, illustrated in FIG. 14, provision is made for the target 168 to be arranged with the ablation region 176 in a gas stream 230 emanating from a nozzle 228 and aimed at the flat material 24, the alignment of the ablation region 176 preferably being selected such that the propagating coating particle stream 170 essentially flows along with the gas stream 230. With the gas stream 230, on the one hand, balancing-out of the coating particle stream density gradient is achieved by collisions and, on the other hand, by variation of an average flow direction 232 of the gas stream, for example, by moving it in the transverse direction 206, there is the possibility of achieving additional balancing-out of the coating particle density stream gradient in the coating particle density stream 170 and, therefore, better balancing-out of the coating particle density gradient occurs than merely with collision interaction with the gas atmosphere 220.

Figure 15:
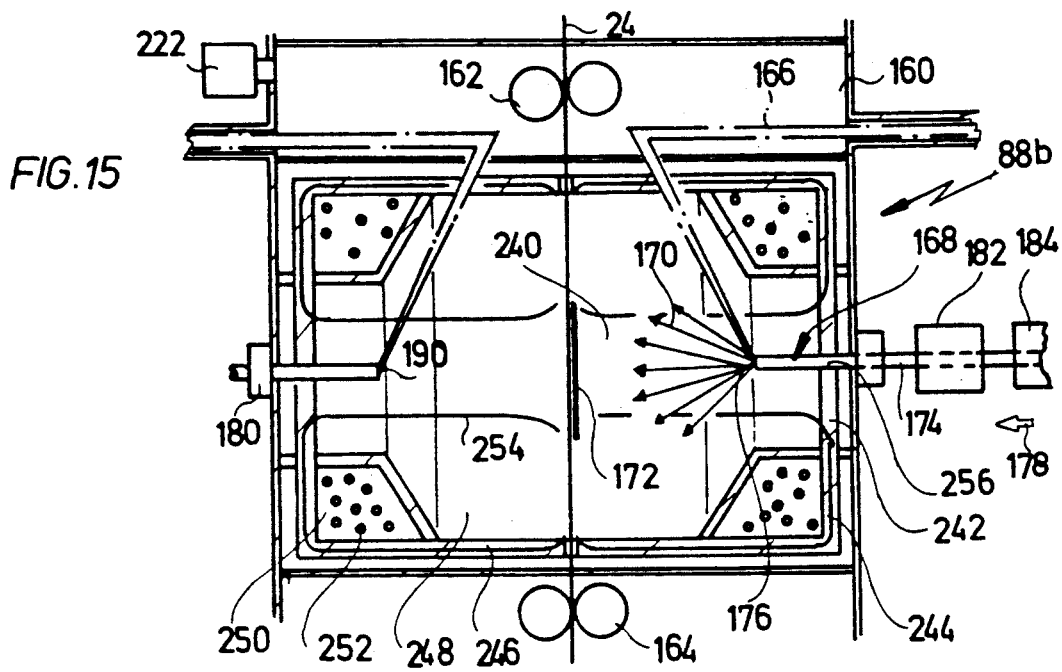
FIG. 15 a second embodiment of a coating unit according to the invention.

In a particularly advantageous second embodiment of the inventive coating unit 88b, illustrated in FIG. 15, the same arrangement of the target 168 is chosen as in the first embodiment 88a. Insofar as the same reference numerals are used, the same parts are used in the coating unit 88b. Therefore, for a description of these, reference is to be had to the statements on the embodiment 88a.

In the coating unit 88b, in contrast with the coating unit 88a, a glow discharge 240 extending between an anode 242 and the flat material 24 as cathode is provided. Herein the anode 242 is preferably arranged in yoke-type configuration and comprises a yoke bar 244 extending essentially parallel to the flat material 24 and yoke legs 246 arranged at the side of the yoke bar and extending in the direction towards the flat material 24 and delimiting a yoke interior 248.

There is, furthermore, provided in the interior, more specifically, essentially in the areas facing the yoke legs, a coil 250 whose windings 252 run essentially along the yoke legs 246.

The anode 242 is preferably of pot-shaped design and extends in the transverse direction 206 over the entire width of the flat material 24.

The coil 250 generates a magnetic field whose field lines 254 extend essentially perpendicular away from the flat material 24 to the yoke bar 244, more specifically, within the coil 250, and in the yoke bar 244 then return via the yoke legs 246 to the flat material 24. For this purpose, the anode 242 is preferably made of a magnetizable material.

The glow discharge 240, supported by the field lines 254, therefore, extends between the yoke bar 244 and the flat material 24 essentially within the coil 250 and in the area of the field lines 254 having the greatest field strength.

For this reason, the ablation region 176 is arranged in the area of the glow discharge, for which purpose, the yoke bar 244 has in a central area an opening 256 through which the round bar stock 174 coming from the lock 180 protrudes.

The coating particle stream 170 thus propagating from the ablation region 186, therefore, extends in the area of the glow discharge 240 which is maintained by a pressure of $10^{-4}$ to $10^{-2}$ mb prevailing in the coating chamber 160, this pressure preferably being maintained by a noble gas atmosphere, for example, argon. This argon is supplied via a metering valve 260.

The propagation of the coating particle stream 170 in the glow discharge 240 results in several physical effects.

A collision interaction first occurs between the coating particles and the gas molecules or atoms as the gas required for the glow discharge 240 is present at a pressure of $10^{-4}$ to $10^{-2}$ bar. These collisions between the gas atoms or molecules and the coating particles result in a partial thermalization of the neutral particles moving with an energy of, for example, 2-10 EV in the coating particle stream 170. As a rule, a small percentage of a few percent of ions occurring during the laser ablation in the ablation region 176 will also be present in the coating particle stream 170.

At the same time, an additional ionization of the coating particles of the coating particle stream occurs owing to collisions of the rapid electrons in the glow discharge, for which a minimum size of the free path length is necessary.

All of the ions, both those in the coating particle stream 170 and those of the gas responsible for the glow discharge now travel in accordance with the field strength responsible for the glow discharge 240 between the anode 242 and the flat material 24 in the direction of the flat material 24.

In the cathode case, an acceleration of all ions then occurs in accordance with the voltage drop of the cathode case, with kinetic energies of several 100 eV being achievable. These ions accelerated in the cathode case now strike the coating 172 growing on the flat material 24 with the result that, in all, a more stable coating grows as the additional kinetic energy of these ions causes the coating particles to deposit with more regularity, in particular, including advantageous flakes in accordance with the prevailing binding energies.

Special advantages are gained with use of the glow discharge 240 when the spacing between the ablation region 176 and the flat material 24 is selected such that in the order of magnitude of 1 to 100 collisions occur between the coating particles and the atoms or molecules of the gas forming the glow discharge 240. In this case, a partial thermalization of the coating particle stream is achieved before it strikes the flat material 24. In particular, braking of the high-energy ions, for example, with an energy of the order of magnitude of $>1000$ eV, which have a negative effect on the firmness of the coating 172, is achievable.

Figure 16:
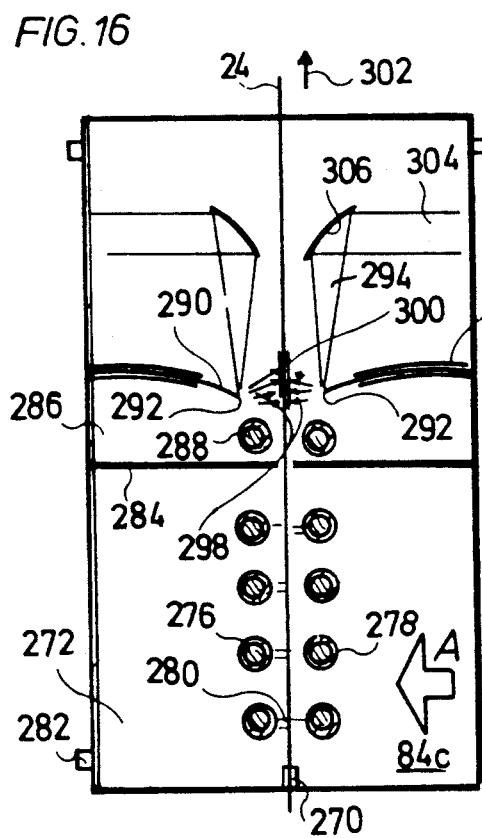
FIG. 16 a third embodiment of a coating unit according to the invention combined with physical activation.

A further embodiment of an inventive coating unit 88c, combined with an inventive activation unit 84c, illustrated in FIG. 16, shows guidance of the continuous strip 24 not from the top to the bottom as in the first embodiment 84a and 88a, but from the bottom to the top. The continuous strip first enters through a lock 270 an activation chamber 272 which is evacuated by a vacuum pump 274.

A medium high vacuum of $10^{-2}$ to $10^{-3}$ mb prevails in this activation chamber.

Figure 17:
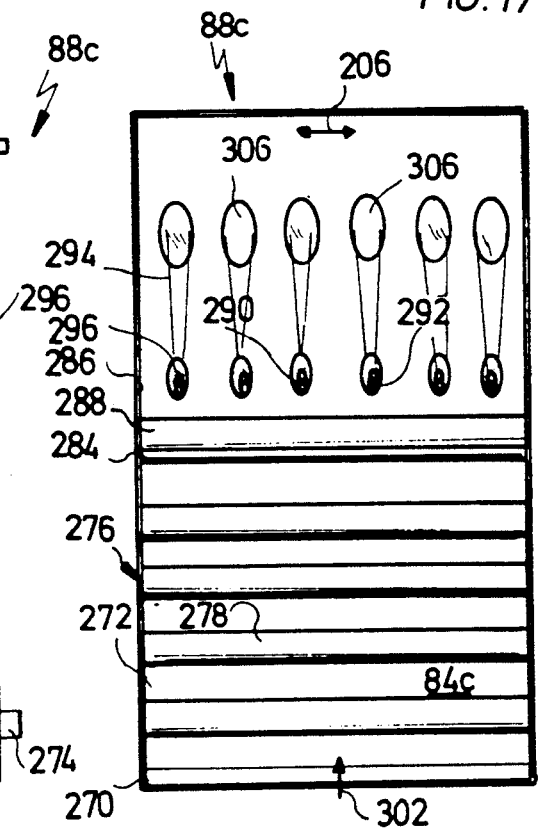
FIG. 17 a view of the coating unit according to FIG. 16 in the direction of arrow A.

Electrode rods 276 are arranged on either side of the continuous strip 24 in the activation chamber 272. As illustrated in FIG. 17, these extend in the transverse direction 206 transversely to the direction of travel of the continuous strip 24 and at least over the width of the continuous strip 24 in the transverse direction 206. These electrode rods 276 are provided with a ceramic coating 278 which as dielectric serves to prevent point-shaped burning-through of a glow discharge.

All of the electrode rods 276 are connected to a high-frequency generator, not illustrated in the drawings, which generates a high-frequency voltage between the continuous strip 24 and the electrode rods on either side of the continuous strip 24 so that a high-frequency field between the electrode rods and the continuous strip 24 results in a glow discharge 280 on either side of the latter. Owing to this glow discharge 280, ions are accelerated in the direction towards the continuous strip 24 and the continuous strip 24 is thus subjected to ion bombardment which results in the same way as in the previously described activation unit 84 in all atoms or molecules still adsorbed on the continuous strip 24 becoming detached.

This is furthered by the constant pumping-off with the vacuum pump 274. To keep the pressure in the activation chamber constant, a regulating valve 282 is provided for feeding in a metered manner a gas required for the glow discharge 280, for example, a noble gas, into the activation chamber to maintain the preselected medium high vacuum in the range of $10^{-2}$ to $10^{-3}$.

The activation chamber 272 is closed off in the direction of the coating unit 88c by a separating wall 284 through which the continuous strip 24 is guided in a non-contacting manner.

In a coating chamber 286, firstly, electrode rods 288 are again arranged on either side of the continuous strip 24 and are likewise provided with a ceramic coating serving as dielectric. These two electrode rods 288 are again connected to a high-frequency source which generates a glow discharge between the electrode rods 288 and the continuous strip 24.

Furthermore, targets in the form of strands 290 whose front end forms an ablation region 292 acted upon by a laser beam 294 open onto the continuous strip 24 on either side thereof in the coating chamber.

The strands of the coating material 290 are fed by the feed holder 296 up to shortly before the ablation region 292. The feed holder 296 simultaneously serves as lock to introduce the strands 290 made continuously available outside the coating chamber 286 into the coating chamber in a vacuum-tight manner.

The strands 290 are preferably guided with their front end at an acute angle to the continuous strip 24 and acted upon by laser radiation which is reflected approximately parallel to the continuous strip 24 before the ablation region 292 is acted upon so that starting from the ablation region 292, a coating particle stream 298 is formed essentially perpendicular or inclined at an obtuse angle to the continuous strip 24, propagates in the direction of the continuous strip 24 and causes the coating 300 to be applied thereto.

In accordance with the invention, the plane of the electrode rods 288 is selected so as to lie, in relation to the direction of travel 302, slightly upstream from the plane in which the ablation regions 292 lie. This is to enable the glow discharge to propagate into the coating particle stream 298 and thereby moderate the coating particle stream 298 in the same way as the coating particle stream 170 in the coating unit 88b according to FIG. 15.

The laser beam 294 is preferably imaged in the form of a parallel laser beam 304 which strikes a concave reflection mirror 306 which then focuses the laser beam 294 onto the ablation region 292. The mirror 306 thus serves to image the laser beam 304 in the direction parallel to the continuous strip 24 and at the same time to focus it onto the ablation region 292. The parallel laser beam 304 is preferably introduced in a direction perpendicular to the plane of the continuous strip 24.

As illustrated in detail in FIG. 17, the electrode rods 288 likewise extend over the entire width of the continuous strip 24, preferably beyond it.

Furthermore, a plurality of ablation regions 292 is arranged in succession and preferably at the same spacing in the transverse direction 206, which results in overlapping coating particle streams 292 starting from these ablation regions and having on account of their overlapping an essentially constant coating stream density.

As likewise illustrated in FIG. 17, a laser beam 304 is introduced for each ablation region 292 and focused in the form of the laser beam 294 onto this ablation region. A separate laser is preferably provided for beaming-in the laser beam 304. As an alternative to this, it is, however, also conceivable to divide a laser beam up into the plurality of laser beams 304 by a suitable optical means so that the laser beams 304 impinge simultaneously or to switch a laser beam on from ablation region 292 to ablation region 292 with respect to time by an optical switching means.

Figure 18:
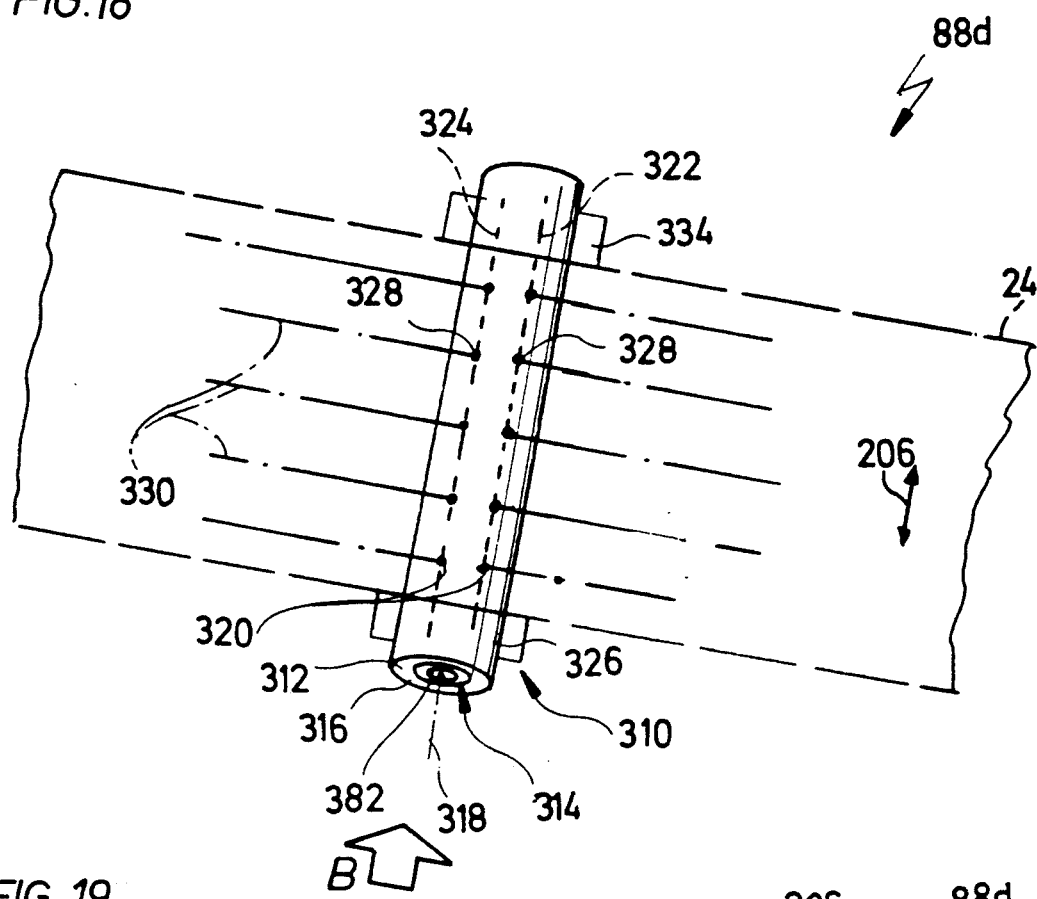
FIG. 18 a partial illustration of a fourth embodiment of a coating unit.
Figure 19:
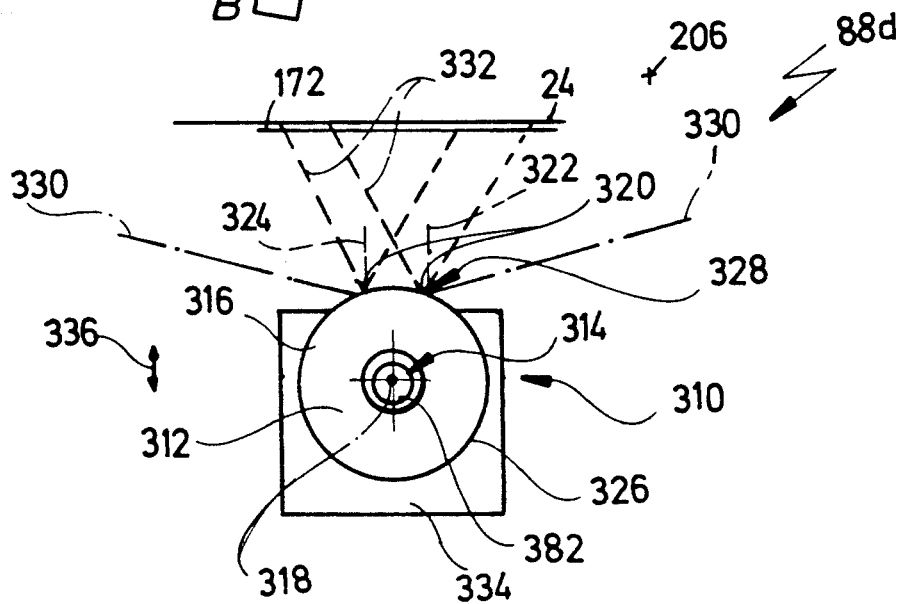
FIG. 19 a side view of the fourth embodiment of the coating unit in the direction of arrow C in FIG. 18.

A further embodiment of an inventive coating unit 88d, illustrated in FIGS. 18 and 19, shows a basically different target arrangement.

In this embodiment, a roll 312 of circular-cylindrical cross-section with coating material 316 applied to a roll core 314 is provided as target 310. This coating material 316 may comprise a single element or a single compound or also a mixture of single elements and single compounds.

The roll 312 is mounted with its roll core 314 for rotation about its cylinder axis 318.

The coating material 316 is ablated, as illustrated in FIG. 18, in a plurality of ablation regions 320 which are arranged in two rows 322 and 324 on a circumferential surface 326 of the roll 312.

The ablation regions 320 are fixed by the focus spot 328 of the respective laser beams 330.

All of the laser beams 330 extend parallel to one another and act upon the ablation regions arranged equidistantly in the transverse direction 206. The coating particle streams 332 emanating from the ablation regions 320 overlap one another mutually and form a common coating particle stream in the direction towards the continuous strip 24 which on account of the overlapping of the individual coating particle streams has on average an approximately constant coating particle stream density.

The ablation regions arranged in the opposite rows 322 and 324 are preferably acted upon by laser beams 330 impinging from opposite sides on the circumferential surface 226, and an inclination of the respective laser beams 330 relative to a tangent to the circumferential surface 326 can be used by the ablation region 330 to change the direction in which the coating particle stream 332 propagates. This is necessary particularly when a considerable amount of coating material 316 is removed from the roll 312.

To remove the coating material from the roll 312 as uniformly as possible, the roll is rotated about its cylinder axis 318.

In addition, it is, however, also necessary to readjust the roll with respect to the spacing of the ablation regions 320 from the continuous strip 324, namely such that this spacing remains constant essentially during the entire coating. This is preferably carried out by a drive and readjustment device 334 for rotating the roll 312 about its cylinder axis 318. During the rotation, the drive and readjustment device 334 adjusts the roll 312 in the feed direction 336 towards the continuous strip 324 in accordance with the removed coating material and thereby keeps the spacing between the ablation regions 320 and the continuous strip 324 constant.

To keep the ablation of the coating material 316 from the roll 312 as constant as possible over the entire circumferential surface 326, provision is preferably made for the ablation regions 320 along the rows 322 and. 324 to travel in the transverse direction 206 relative to the circumferential surface 326. This is preferably made possible by the roll 312 being moved by the drive and readjustment device 334 simultaneously in the transverse direction 206. The roll 312 is thereby ablated in the region of its entire circumferential surface.

It is, however, even more advantageous for the ablation regions 320 to travel oscillatingly back and forth on the stationary roll in the transverse direction 206 by movement of the laser beams 330 in the transverse direction. On the one hand, the roll 312 is thereby worked off completely on the circumferential surface 326 and, on the other hand, the coating particle streams 332 travel at the same time relative to the flat material or continuous strip 24 and so a further balancing-out of any locally different coating particle stream densities in the transverse direction 206 occurs.

Figure 20:
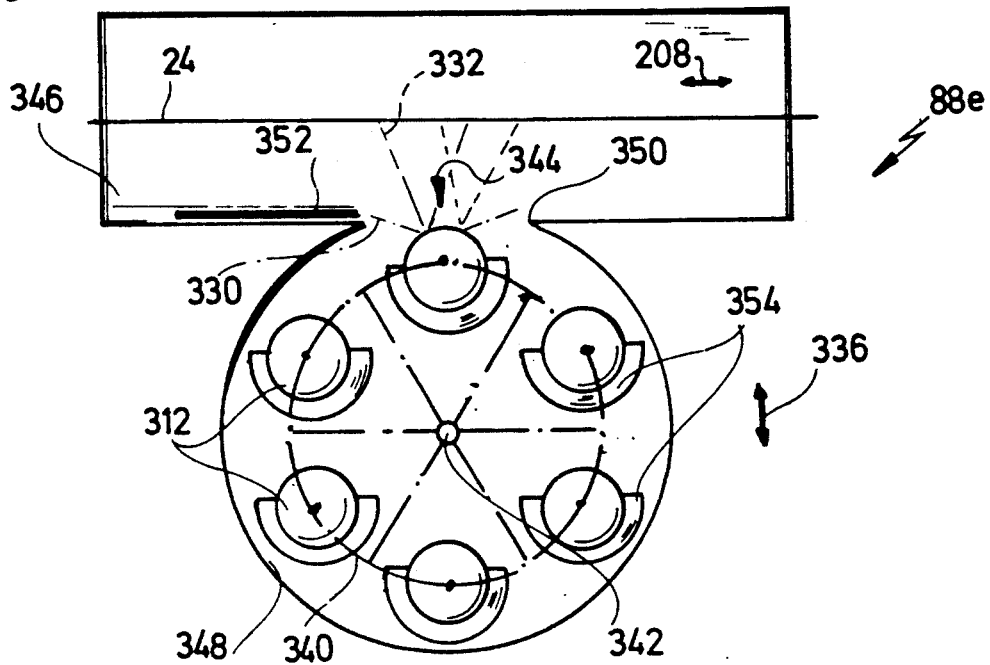
FIG. 20 a fifth embodiment of a coating unit according to the invention.

In a further embodiment 88e of the inventive coating unit, illustrated in FIG. 20, several rolls 312 are mounted for rotation in a revolving drum 340, the revolving drum 340 itself being, in turn, rotatable about a revolving drum axis 342.

One of the rolls 312 is respectively positionable in a target position 344 by the revolving drum 340 so that the coating material 316 is ablated in the same way as described in connection with the coating unit 88d from the roll standing in this target position 344. The entire revolving drum 340 is preferably not arranged in a coating chamber 346 of the coating unit 88d but in a magazine chamber 348 separate from the coating chamber 346, an opening 350 closable by a slide 352 being provided in the area of the target position. The coating particle stream can propagate into the coating chamber 346 through this opening and serve to form the coating 172 on the continuous strip 24.

In order that large quantities of coating material 16 can be made available in accordance with the invention, there is the possibility of ablating the coating material 316 from the roll 312 until the coating material 316 is substantially removed from it. After a short interruption of the coating, the revolving drum 340 is then indexed further so that the next roll 312 comes into the target position and the worked-off roll 312 into the position beside the target position 344. The coating of the continuous strip 24 is now continued in the same way with the next roll 312 in the target position 344.

In the embodiment of the coating unit 88e, provision is preferably made for readjustment of the roll 312 standing in the target position 344 by the entire revolving drum 340 which is mounted for rotation about the revolving drum axis 342 being moved in the feed direction 336 by a drive and displacement unit, not illustrated in the drawings, in the direction towards the continuous strip 24 in order to keep the spacing between the ablation regions 320 and the continuous strip 24 essentially constant, exactly as in the coating unit 88d.

Furthermore, in particular for protecting the rolls 312 not standing in the target position 344, a collecting trough 354 is provided for each of these in the revolving drum 340. The collecting trough encloses the roll standing in the target position 344 essentially on its sides facing away from the ablation regions 320 and collects all of the particles or clusters which fall off the roll during the ablation process and are not transported in the coating particle stream 170 in the direction of the continuous strip 24.

Figure 21:
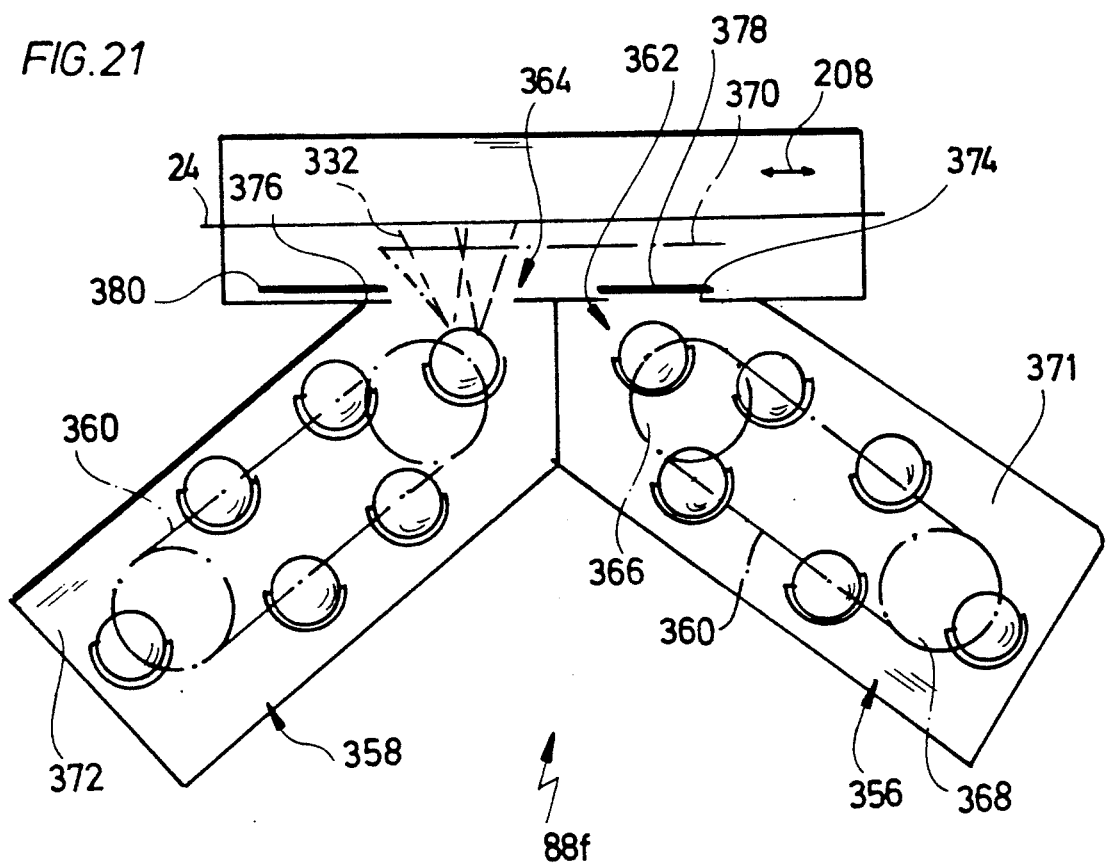
FIG. 21 a sixth embodiment of a coating unit according to the invention.

An improved version of the coating unit 88e is illustrated in the form of coating unit 88f in FIG. 21. In this improved version, the rolls 312 are distributed on two turning stores 356 and 358 which preferably each have a continuous carrier 360 by means of which each of the rolls 312 is transportable into a target position 362 and 364 provided for the respective turning store 356 and 358. The continuous carrier is preferably a conveyor chain on which each of the rolls 312 is rotatably held and which is rotatingly guided at both of its ends on a supporting roller 366 and 368, respectively.

In the two target positions 362 and 364, each roll 312 can be acted upon by a laser beam 370. In accordance with the invention, either the roll 312 is acted upon in the target position 362 or the roll 312 in the target position 364 alternatively.

Furthermore, each of the turning stores 356 and 358 is arranged in a separate magazine chamber 371 and 372, respectively, which communicates with the coating chamber 346 through an opening 374 and 376, respectively. Each of these openings 374 and 376 is closable by a slide 378 and 380, respectively.

The coating unit 88f preferably operates in such a way that either the slide 378 or the slide 380 is open and hence one of the rolls 312 standing in the target position 362 or 364 can be acted upon by the laser beam 370 for ablation purposes. The respective roll is then worked off until the coating material 316 is substantially removed from it. After removal of the coating material from, for example, roll 312 standing in the target position 362, laser ablation can be carried out on the roll 364 likewise standing in its target position, and while the ablation from the roll 312 standing in the target position 364 is taking place, the turning store 356 can be indexed further so that the next roll 312 still provided to the full extent with coating material can be transported into the target position 362.

After removal of the coating material from the roll 312 standing in the target position 364, ablation from the roll 312 standing in the target position 362 and provided with coating material 316 can then be carried out again.

Furthermore, with the slides 378 and 380, there is the possibility of closing the magazine chamber 370 and 372, respectively, and in the closed magazine chamber, for example, during the ablation from the roll of the adjacent turning store 356 and 358, respectively, standing in the target position 362 and 364, respectively, of exchanging that store 358 and 356, respectively, whose magazine chamber 372 and 371, respectively, is separated from the coating chamber 346 by the slide 380 and 378, respectively, together with the rolls 312. This is carried out, for example, when the coating material has been removed from all of the rolls 312 of this turning store 358 and 356, respectively.

As an alternative to this, it is, however, also conceivable in an inventive manner to provide one respective position, for example, the position of the turning store 356 and 358 opposite the target position 362 and 364, respectively, as exchange position in which each roll 312 containing no more coating material 316 is exchanged and replaced by a roll carrying the full coating material.

In all coating units 88d, 88e and 88f using rolls 312, the roll core 314 is preferably designed so as to have a cooling channel through which a coolant can be conducted to cool the respective roll core or also a tempering agent to heat up the respective roll core and hence also the entire roll 312 together with the coating material 316 to a desired temperature.

In the simplest case, this cooling channel is provided as an axial bore 382 in the roll core 314.

A roll core serving as support for the mechanical strength and containing all of the necessary structural elements is usually molded with the coating material in corresponding cylindrical molds. Additional mechanical machining of the surface in the form of turning and/or grinding is necessary to achieve perfect rotational symmetry and a corresponding surface formation for the target. In accordance with the invention, other ways of building up the coating material on the roll core are, however, also possible, for example, by hot-isostatic powder pressing, welding-on, plating-on, attaching apertured discs or disc segments, etc.

We claim:

1. Process for coating substrate material in which coating material is ablated in an ablation region by a laser beam in a coating chamber containing a negative pressure, propagates in the form of a coating particle stream in the direction of said substrate material and is deposited on it in the form of a coating, characterized in that said substrate material is flat material, in that said flat material is passed continuously as a continuous strip through said coating chamber and coated under the negative pressure substantially maintained therein, and in that the necessary coating material is fed to said coating chamber while said negative pressure is substantially maintained therein.

2. Process as defined in claim 1, characterized in that said coating material is fed without interruption of the passage of said continuous strip.

3. Process as defined in claim 1, characterized in that said coating material is fed without interruption of the coating on said continuous strip.

4. Process as defined in claim 1, characterized in that in order to apply a uniform coating to said flat material, said coating particle stream is moved relative to said flat material with a component in the direction transverse to the direction of passage of said continuous strip.

5. Process as defined in claim 4, characterized in that said coating particle stream is swivelled oscillatingly with a component in said transverse direction.

6. Process as defined in claim 4, characterized in that said coating particle stream is moved parallel with a component in said transverse direction.

7. Process as defined in claim 4, characterized in that during the movement of said coating particle stream with a component in said transverse direction, a spacing between said ablation region and said flat material is kept substantially constant.

8. Process as defined in claim 4, characterized in that in order to move said coating particle stream with a component in said transverse direction, said ablation region is moved with a component in said transverse direction.

9. Process as defined in claim 1, characterized in that several ablation regions are provided.

10. Process as defined in claim 9, characterized in that the spacing between said ablation regions in said transverse direction is chosen such that there is essentially no superimposing of the coating particle streams emanating from the individual ablation regions.

11. Process as defined in claim 9, characterized in that the spacing between said ablation regions is chosen such that the coating particle streams emanating from them superimpose one another.

12. Process as defined in claim 11, characterized in that the spacing is chosen such that the coating particle streams superimposing one another form an overall coating particle stream with a substantially constant coating particle stream density.

13. Process as defined in claim 9, characterized in that said ablation regions spaced from one another in the transverse direction are ablated one after the other with a laser beam.

14. Process as defined in claim 9, characterized in that said ablation regions spaced from one another in the transverse direction are simultaneously ablated with one laser beam each.

15. Process as defined in claim 1, characterized in that several ablation regions for coating material are arranged in succession in the direction of passage of said continuous strip.

16. Process as defined in claim 15, characterized in that the coating material is different in said ablation regions arranged in succession in the direction of passage of said continuous strip.

17. Process as defined in claim 16, characterized in that said coating particle streams carry the same coating material.

18. Process as defined in claim 15, characterized in that said flat material is coated by a first coating particle stream having essentially a constant coating particle density in said transverse direction and simultaneously by a second coating particle stream arranged in offset relation in the direction of passage of said continuous strip and having essentially a constant coating particle stream density in said transverse direction.

19. Process as defined in claim 15, characterized in that said coating particle streams carry different coating material.

20. Process as defined in claim 1, characterized in that said coating material is ablated from a molten mass.

21. Process as defined in claim 1, characterized in that said coating material is ablated from a solid.

22. Process as defined in claim 21, characterized in that said solid is made of coating material.

23. Process as defined in claim 21, characterized in that said solid is made of several coating materials.

24. Process as defined in claim 23, characterized in that said solid comprises several coating materials arranged spatially separate from one another.

25. Process as defined in claim 23, characterized in that said solid comprises several coating materials which are homogeneously mixed.

26. Process as defined in claim 1, characterized in that said coating material is introduced in the form of a target into said coating chamber.

27. Process as defined in claim 26, characterized in that said ablation region is arranged on an end face of said target consisting of coating material.

28. Process as defined in claim 26, characterized in that said ablation region is arranged at a front lateral end of said target consisting of coating material.

29. Process as defined in claim 26, characterized in that said ablation region travels by relative movement between said target and said laser beam.

30. Process as defined in claim 29, characterized in that the travel of said ablation region results in a shape of said target which remains constant in its ablated regions.

31. Process as defined in claim 29, characterized in that the relative movement between laser beam and target is brought about by movement of said laser beam.

32. Process as defined in claim 29, characterized in that the relative movement between laser beam and target is brought about by movement of said target.

33. Process as defined in claim 26, characterized in that said target is in the form of a continuous strand.

34. Process as defined in claim 33, characterized in that said strand has a round cross-section.

35. Process as defined in claim 33, characterized in that said strand is in the form of a strip.

36. Process as defined in claim 33, characterized in that said strand is introduced into said coating chamber through a sealed lock and is constantly fed.

37. Process as defined in claim 26, characterized in that said target is formed by pieces of coating material which are separated from one another.

38. Process as defined in claim 37, characterized in that said coating material is introduced in these pieces into said coating chamber.

39. Process as defined in claim 38, characterized in that said pieces are introduced into said coating chamber through a lock.

40. Process as defined in claim 38, characterized in that during the ablation of said coating material from one piece, a further piece is introduced into said coating chamber.

41. Process as defined in claim 37, characterized in that said pieces have the shape of elongated cylinders.

42. Process as defined in claim 41, characterized in that said cylinders are mounted rotatingly about their cylinder axis.

43. Process as defined in claim 41, characterized in that said cylinder axis extends transversely to the direction of movement of said continuous strip.

44. Process as defined in claim 43, characterized in that said cylinder axis is oriented substantially parallel to the surface of said flat material.

45. Process as defined in claim 37, characterized in that said pieces are arranged in a magazine chamber.

46. Process as defined in claim 45, characterized in that said magazine chamber and said coating chamber are separable from one another in a vacuum-tight manner.

47. Process as defined in claim 46, characterized in that ablation is carried out on at least one piece from a magazine chamber.

48. Process as defined in claim 47, characterized in that pieces used up by the ablation are replaced in said magazine chamber separated in a vacuum-tight manner from said coating chamber.

49. Process as defined in claim 45, characterized in that several magazine chambers are provided.

50. Process as defined in claim 37, characterized in that said pieces are arranged in a turning magazine.

51. Process as defined in claim 50, characterized in that said pieces are aligned parallel to one another in said turning magazine.

52. Process as defined in claim 51, characterized in that and turning magazine is recharged with said pieces.

53. Process as defined in claim 46, characterized in that said turning magazine is seated in said magazine chamber.

54. Process as defined in claim 37, characterized in that said pieces are simultaneously acted upon by several laser beams and have several ablation regions.

55. Process as defined in claim 54, characterized in that said ablation regions are spaced from one another in said transverse direction.

56. Process as defined in claim 37, characterized in that said pieces extend in a direction transverse to the direction of movement of said continuous strip.

57. Process as defined in claim 37, characterized in that said ablation region travels owing to relative movement between said piece and said laser beam.

58. Process as defined in claim 1, characterized in that the atoms or molecules of said ablated coating material build up said coating on said flat material without chemically reacting in said coating particle stream.

59. Process as defined in claim 1, characterized in that the atoms or molecules of said ablated coating material react with a reactive gas penetrating said coating particle stream to produce a chemical compound which forms at least part of said coating on said flat material.

60. Process as defined in claim 1, characterized in that said coating particle stream is acted on additionally on its path between said ablation region and said flat material to reduce a coating particle stream density gradient in this coating particle stream.

61. Process as defined in claim 60, characterized in that said coating particle stream is acted upon by further particles.

62. Process as defined in claim 61, characterized in that said further particles are gas particles.

63. Process as defined in claim 61, characterized in that said further particles are supplied in the form of a particle stream impinging on said coating particle stream.

64. Process as defined in claim 61, characterized in that a velocity moderation of said coating particles in said coating particle stream is carried out by said further particles.

65. Process as defined in claim 60, characterized in that said coating particle stream interacts with said further particles by collisions.

66. Process as defined in claim 65, characterized in that said coating particle stream has on average at least approximately one collision with said further particles on its path from said ablation region to said flat material.

67. Process as defined in claim 60, characterized in that said further particle stream is moved with a component in the direction transverse to the direction of passage of said continuous strip and moves said coating particle stream along with it in the transverse direction by this movement.

68. Process as defined in claim 60, characterized in that said coating particle stream is acted upon by a gas discharge.

69. Process as defined in claim 68, characterized in that said gas discharge is a glow discharge.

70. Process as defined in claim 69, characterized in that said glow discharge is maintained by further discharge particles.

71. Process as defined in claim 70, characterized in that said further discharge particles interact with said coating material stream.

72. Process as defined in claim 70, characterized in that said further discharge particles interact with said coating material stream by collisions.

73. Process as defined in claim 69, characterized in that said glow discharge is stabilized by a magnetic field.

74. Process as defined in claim 60, characterized in that said coating particle stream is acted upon by radiation.

75. Process as defined in claim 74, characterized in that said coating particle stream is acted upon by electromagnetic radiation.

76. Process as defined in claim 74, characterized in that said coating particle stream is acted upon by electron radiation.

77. Process as defined in claim 60, characterized in that said coating particle stream is acted upon selectively by radiation to decrease said coating particle stream gradient.

78. Process as defined in claim 1, characterized in that said coating particle stream is acted upon additionally on its path between said ablation region and said flat material to decrease energy differences between said coating particles.

79. Process as defined in claim 78, characterized in that said coating particle stream is acted upon by ions.

80. Process as defined in claim 79, characterized in that said coating particle stream is acted upon by a glow discharge.

81. Process as defined in claim 79, characterized in that said coating particle stream is acted upon by an electronic and/or magnetic field.

82. Process as defined in claim 78, characterized in that said coating particle stream is acted upon by radiation.

83. Process as defined in claim 1, characterized in that said coating is acted upon by high-energy particles during its growth on said flat material to improve the characteristics.

84. Process as defined in claim 83, characterized in that said coating is acted upon by ion bombardment.

85. Process as defined in claim 84, characterized in that said coating is acted upon by a gas discharge.

86. Process as defined in claim 85, characterized in that said coating is acted upon by a glow discharge.

87. Process as defined in claim 83, characterized in that said coating is acted upon by electrons.

88. Process as defined in claim 1, characterized in that said continuous strip is conducted through a lock before and after said coating chamber.

89. Process as defined in claim 88, characterized in that said continuous strip is conducted in a non-contacting manner in said coating chamber.

90. Process as defined in claim 88, characterized in that said continuous strip is conducted essentially in the vertical direction in said coating chamber.

91. Process as defined in claim 1, characterized in that said continuous strip is produced by a mechanical unit for providing said continuous strip.

92. Process as defined in claim 91, characterized in that a device for storage of said strip is arranged so as to follow said mechanical unit for providing said continuous strip.

93. Process as defined in claim 1, characterized in that prior to the coating with coating material, said continuous strip is conducted through a chemical pretreatment unit.

94. Process as defined in claim 93, characterized in that said chemical pretreatment unit comprises an alkaline degreasing unit.

95. Process as defined in claim 94, characterized in that said alkaline degreasing unit comprises spray degreasing.

96. Process as defined in claim 94, characterized in that said alkaline degreasing unit comprises electrolytic degreasing.

97. Process as defined in claim 96, characterized in that said electrolytic degreasing is arranged so as to follow said spray degreasing.

98. Process as defined in claim 97, characterized in that said electrolytic degreasing is separated from said spray degreasing by a brush machine.

99. Process as defined in claim 94, characterized in that cascade rinsing is arranged at the end of said alkaline degreasing unit.

100. Process as defined in claim 99, characterized in that said cascade rinsing is preceded by a brush machine.

101. Process as defined in claim 93, characterized in that said chemical pretreatment unit comprises acidic pickling.

102. Process as defined in claim 101, characterized in that said acidic pickling is arranged so as to follow said alkaline degreasing unit.

103. Process as defined in claim 101, characterized in that said acidic pickling comprises an electrolytic zone.

104. Process as defined in claim 103, characterized in that a cascade rinsing is arranged so as to follow said electrolytic zone.

105. Process as defined in claim 104, characterized in that said cascade rinsing is preceded by a brush machine.

106. Process as defined in claim 93, characterized in that said chemical pretreatment unit comprises a drier at the end.

107. Process as defined in claim 1, characterized in that a physical pretreatment unit is provided.

108. Process as defined in claim 107, characterized in that said physical pretreatment unit follows said chemical pretreatment unit.

109. Process as defined in claim 107, characterized in that the physical pretreatment unit comprises a degasification unit.

110. Process as defined in claim 109, characterized in that to promote the desorption, said continuous strip is heated up and/or subjected to electron bombardment and/or ion bombardment and/or plasma radiation and/or laser light and/or UV light in said degasification unit.

111. Process as defined in claim 109, characterized in that said degasification unit is preceded and followed by a lock in order to maintain the pressure therein.

112. Process as defined in claim 107, characterized in that said physical pretreatment unit comprises a preheating unit.

113. Process as defined in claim 112, characterized in that heating-up of said continuous strip is carried out in an inert gas atmosphere in said preheating unit.

114. Process as defined in claim 107, characterized in that said physical pretreatment unit comprises a physical activation unit.

115. Process as defined in claim 114, characterized in that said physical activation unit is arranged so as to follow said degasification unit.

116. Process as defined in claim 115, characterized in that said preheating unit is arranged between said degasification unit and said physical activation unit.

117. Process as defined in claim 114, characterized in that activation of said flat material is carried out in said physical activation unit by electron bombardment and/or ion bombardment and/or bombardment with plasma beams and/or bombardment with laser light and/or irradiation with UV light.

118. Process as defined in claim 117, characterized in that the ion bombardment is carried out in said physical activation unit by means of a glow discharge.

119. Process as defined in claim 118, characterized in that said glow discharge is generated by yoke-shaped anodes.

120. Process as defined in claim 119, characterized in that said glow discharge is stabilized by a magnetic field.

121. Process as defined in claim 119, characterized in that said glow discharge is promoted by thermally emitted electrons in an auxiliary current circuit.

122. Process as defined in claim 118, characterized in that said glow discharge takes place in a pressure range of from $10^{-2}$ to $5 \times 10^{-4}$ mbar.

123. Process as defined in claim 119, characterized in that coils for generating the magnetic field are arranged in said yoke-shaped anodes.

124. Process as defined in claim 123, characterized in that said yoke-shaped anodes are mode of magnetizable material.

125. Process as defined in claim 114, characterized in that the pressure in said physical activation unit is the same as the pressure in said coating chamber with respect to the order of magnitude.

126. Process as defined in claim 114, characterized in that said physical activation unit comprises several activation chambers.

127. Process as defined in claim 114, characterized in that physical pretreatment takes place prior to the coating procedure in a pretreatment chamber which is not separate from the coating chamber.

128. Process as defined in claim 114, characterized in that physical activation takes place in a pretreatment chamber which is separate from the coating chamber.

* * * * *